United States Patent
Kong et al.

(10) Patent No.: US 11,362,247 B2
(45) Date of Patent: Jun. 14, 2022

(54) SEMICONDUCTOR DEVICE, METHOD OF FABRICATING THE SAME, AND DISPLAY DEVICE INCLUDING THE SAME

(71) Applicant: SAMSUNG ELECTRONICS CO., LTD., Suwon-si (KR)

(72) Inventors: Kiho Kong, Suwon-si (KR); Junhee Choi, Seongnam-si (KR); Jinjoo Park, Yongin-si (KR); Joohun Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/842,933

(22) Filed: Apr. 8, 2020

(65) Prior Publication Data

US 2021/0091279 A1    Mar. 25, 2021

(30) Foreign Application Priority Data

Sep. 25, 2019 (KR) ................ 10-2019-0118376

(51) Int. Cl.
*H01L 33/64* (2010.01)
*H01L 33/62* (2010.01)
*H01L 33/38* (2010.01)
*H01L 27/15* (2006.01)

(52) U.S. Cl.
CPC ............ *H01L 33/62* (2013.01); *H01L 27/156* (2013.01); *H01L 33/382* (2013.01); *H01L 2933/0033* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 2009/0072267 A1* | 3/2009 | Goshonoo | H01L 27/15 257/103 |
| 2012/0223875 A1 | 9/2012 | Lau et al. | |
| 2013/0299841 A1* | 11/2013 | Ranglack | H01L 31/03044 257/76 |
| 2016/0211427 A1* | 7/2016 | Jeong | H01L 33/62 |
| 2017/0309676 A1* | 10/2017 | Odnoblyudov | H01L 27/15 |

OTHER PUBLICATIONS

Zhao Jun Liu et al., "Monolithic Integration of AlGaN/GaN HEMT on LED by MOCVD", IEEE Electron Device Letters, vol. 35, No. 3, Mar. 2014, pp. 330-332, 3 pages total.

(Continued)

*Primary Examiner* — Ratisha Mehta
(74) *Attorney, Agent, or Firm* — Sughrue Mion, PLLC

(57) ABSTRACT

A semiconductor device includes a substrate including a first region and a second region that are arranged in a first direction that is parallel to an upper surface of the substrate; a separation layer provided on the first region of the substrate; a high electron mobility transistor (HEMT) device overlapping the separation layer in a second direction that is perpendicular to the upper surface of the substrate; a light-emitting device provided on the second region of the substrate; and a first insulating pattern covering a side surface of the HEMT device, wherein the first insulating pattern overlaps the separation layer in the second direction.

12 Claims, 21 Drawing Sheets

(56) References Cited

OTHER PUBLICATIONS

David S. Meyaard et al., "Mesa-Free III-V Nitride Light-Emitting Diodes with Flat Surface", ECS Solid State Letters, 3 (4), Feb. 12, 2014, Q17-Q19, 3 pages total.
Chao Liu et al., "Metal-interconnection-free integration of InGaN/GaN light emitting diodes with AlGaN/GaN high electron mobility transistors", Applied Physics Letters, 106, 181110, doi: 10.1063/1.4921049, May 8, 2015, pp. 1-4, 5 pages total.
Yuefei Cai et al., "Controllable Uniform Green Light Emitters Enabled by Circular HEMT-LED Devices", IEEE Photonics Journal, vol. 10, No. 05, DOI: 10.1109/JPHOT.2018.2867821, 4900607, Sep. 5, 2018, 8 pages total.

\* cited by examiner

SEMICONDUCTOR DEVICE, METHOD OF FABRICATING THE SAME, AND DISPLAY DEVICE INCLUDING THE SAME

CROSS-REFERENCE TO RELATED APPLICATION

This application claims priority to Korean Patent Application No. 10-2019-0118376, filed on Sep. 25, 2019, in the Korean Intellectual Property Office, the disclosure of which is incorporated by reference herein in its entirety.

BACKGROUND

1. Field

Example embodiments of the present disclosure relate to semiconductor devices, methods of manufacturing the semiconductor devices, and display devices including the semiconductor devices.

2. Description of Related Art

As a display device, a liquid crystal display (LCD) and an organic light-emitting diode (OLED) display are widely used. Recently, a technology for manufacturing a high resolution display device using a micro-light-emitting diode (micro-LED) has been studied. However, in order to manufacture a high-resolution display device using a micro-LED, high efficiency small LED chips must be manufactured, and in order to arrange the small LED chips in appropriate locations, a high level of transfer technology is required.

SUMMARY

Provided are semiconductor devices having a high degree of integration.

Provided are semiconductor devices having a high resolution.

Provided are methods of manufacturing a display device with high productivity.

However, the present disclosure is not limited thereto.

Additional aspects will be set forth in part in the description which follows and, in part, will be apparent from the description, or may be learned by practice of the presented embodiments of the disclosure.

According to an aspect of an example embodiment, there is provide a semiconductor device including: a substrate including a first region and a second region that are arranged in a first direction that is parallel to an upper surface of the substrate; a separation layer provided on the first region of the substrate; a high electron mobility transistor (HEMT) device overlapping the separation layer in a second direction that is perpendicular to the upper surface of the substrate; a light-emitting device provided on the second region of the substrate; and a first insulating pattern covering a side surface of the HEMT device, wherein the first insulating pattern overlaps the separation layer in the second direction.

The separation layer may include a first region that overlaps the HEMT device and a second region that overlaps the first insulating pattern, and wherein a thickness of the first region of the separation layer in the second direction is greater than a thickness of the second region of the separation layer in the second direction.

The semiconductor device of claim 1 may include a second insulating pattern covering side surfaces of the light-emitting device, wherein the second insulating pattern is provided between the separation layer and the substrate in the second direction.

The light-emitting device may include: an upper semiconductor layer; an active layer provided between the upper semiconductor layer and the substrate; and a lower semiconductor layer provided between the active layer and the substrate, wherein the lower semiconductor layer extends in the first direction between the second insulating pattern and the substrate, wherein the lower semiconductor layer includes a first region that overlaps the active layer in the second direction and a second region that overlaps the second insulating pattern in the second direction, and wherein a thickness of the first region of the lower semiconductor layer in the second direction is greater than a thickness of the second region of the lower semiconductor layer in the second direction.

The semiconductor device may further include: an upper spacer layer provided between the separation layer and the substrate; and a lower spacer layer provided between the upper spacer layer and the substrate, wherein the lower semiconductor layer extends in the first direction between the lower spacer layer and the substrate.

The light-emitting device may overlap the separation layer in the first direction.

The light-emitting device may include: an upper semiconductor layer; an active layer provided between the upper semiconductor layer and the substrate; and a lower semiconductor layer provided between the active layer and the substrate, wherein the lower semiconductor layer, the active layer, and the upper semiconductor layer are sequentially stacked on the second region.

The light-emitting device may include: an inner semiconductor pattern extending in the second direction; a light-emitting pattern covering side surfaces and an upper surface of the inner semiconductor pattern; and an outer semiconductor pattern covering side surfaces and top surfaces of the light-emitting pattern.

The HEMT device may be provided between the substrate and the separation layer.

The light-emitting device may include: an upper semiconductor layer; an active layer between the upper semiconductor layer and the substrate; and a lower semiconductor layer between the active layer and the substrate, wherein the HEMT device extends in the first direction at a position between the upper semiconductor layer and the substrate.

The semiconductor device may further include light extraction patterns on the upper semiconductor layer.

According to an aspect of an example embodiment, there is provided a method of manufacturing a semiconductor device, the method including: preparing a first substrate including a first region and a second region; forming a separation layer on the first region of the first substrate; forming an upper film structure on the separation layer of the second substrate; implanting a first dopant into a side of the upper film structure; and forming a lower film structure between the separation layer and the first substrate, wherein the lower film structure extends in a first direction between the separation layer and the first substrate, the first direction being parallel to an upper surface of the first substrate, wherein the upper film structure includes a channel layer and a channel supply layer that are sequentially stacked, and wherein the implanting the first dopant is performed from an upper surface of the channel supply layer to a bottom surface of the channel layer.

The first dopant may be implanted on the separation layer during the implanting the first dopant into the side of the upper film structure.

The method may further include: implanting a second dopant into a side of the lower film structure on the second region of the first substrate, wherein the lower film structure includes a lower semiconductor layer, an active layer, and an upper semiconductor layer that are sequentially stacked, and wherein the implanting the second dopant is performed from an upper surface of the upper semiconductor layer to a bottom surface of the active layer.

The second dopant may be implanted on the lower semiconductor layer during the implanting the second dopant into the side of the lower film structure.

The method may further include: forming an insulating layer on the upper film structure and the lower film structure; forming a second substrate on the insulating layer; forming a bonding layer between the second substrate and the insulating layer; and removing the first substrate, wherein a bottom surface of the lower semiconductor layer is exposed by the removing the first substrate.

The method may further include forming light extraction patterns under the lower semiconductor layer.

The implanting the first dopant may be simultaneously performed with the implanting the second dopant.

According to an aspect of another example embodiment, there is provided a display device including: a substrate; light-emitting devices provided on the substrate; separation layers respectively provided between the light-emitting devices; high electron mobility transistor (HEMT) devices respectively overlapping the separation layers in a first direction perpendicular to an upper surface of the substrate; first insulating patterns respectively provided on side surfaces of the HEMT devices; and second insulating patterns respectively provided on side surfaces of the light-emitting devices, wherein the first insulating patterns overlap the separation layers in the first direction.

The HEMT devices may be provided between the separation layers and the substrate.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
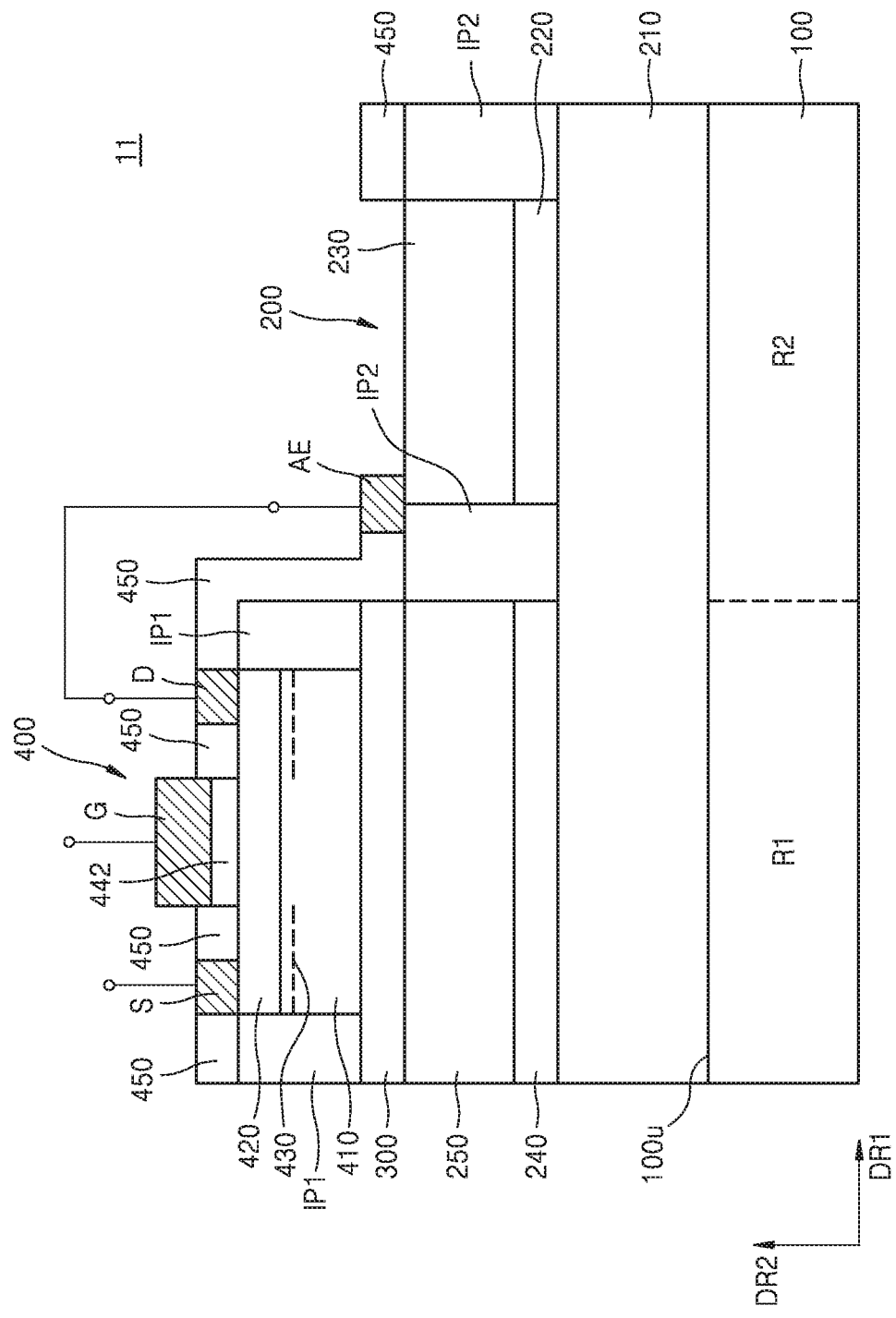
FIG. 1 is a diagram illustrating a semiconductor device according to an example embodiment.

Reference will now be made in detail to example embodiments with reference to the accompanying drawings, wherein like reference numerals refer to like elements throughout. In this regard, embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on" or "above" another element or layer, the element or layer may be directly on another element or layer or there may be intervening elements or layers.

As used herein, the singular forms "a," "an" and "the" are intended to include the plural forms as well, unless the context clearly indicates otherwise. It should be understood that, when a part "comprises" or "includes" an element in the specification, unless otherwise defined, it is not excluding other elements but may further include other elements.

The term "units" etc. may denote units that process at least one function or operation, and may be realized by hardware, software, or a combination of hardware and software.

FIG. 1 is a diagram illustrating a semiconductor device according to an example embodiment.

Referring to FIG. 1, a semiconductor device 11 including a substrate 100, a light-emitting device 200, a separation layer 300, a high electron mobility transistor (HEMT) device 400, first insulating patterns IP1, and second insulating patterns IP2 may be provided. The substrate 100 may include a first region R1 and a second region R2. The first region R1 and the second region R2 may be arranged in a first direction DR1 parallel to an upper surface 100u of the substrate 100. For example, the substrate 100 may include a silicon substrate, a glass substrate, a sapphire substrate, or a silicon substrate coated with $SiO_2$. However, the substrate 100 is not limited thereto.

The separation layer 300 may be provided above the first region R1. The separation layer 300 may electrically separate the HEMT device 400 disposed on the separation layer 300 from a layer under the separation layer 300. The separation layer 300 may include an insulating material. For example, the separation layer 300 may include undoped GaN or carbon doped GaN.

The HEMT device 400 may be provided on the separation layer 300. The HEMT device 400 may include a channel layer 410, a channel supply layer 420, a depletion formation pattern 442, a gate electrode G, a source electrode S, and a drain electrode D. The channel layer 410 may include a III-V group compound semiconductor. For example, the channel layer 410 may include GaN.

The channel supply layer 420 may include a semiconductor layer that is different from the channel layer 410. The channel supply layer 420 may form a 2-dimensional electron gas (2DEG) layer 430 in the channel layer 410. The 2DEG layer 430 may be formed in the channel layer 410 adjacent to an interface between the channel supply layer 420 and the channel layer 410. The channel supply layer 420 may have different polarization characteristics, energy bandgap, and/or lattice constant from that of the channel layer 410. For example, the channel supply layer 420 may have a polarization rate and/or energy bandgap greater than those of the channel layer 410. The channel supply layer 420 may include one or more materials selected from nitrides including at least one of Al, Ga, In, and B. For example, the channel supply layer 420 may include at least one of AlGaN, AlInN, InGaN, AlN, and AlInGaN. The channel supply layer 420 may have a single layer structure or a multi-layer structure.

The depletion formation pattern 442 may be provided on the channel supply layer 420. The depletion formation pattern 442 may increase an energy bandgap of a portion of the channel supply layer 420 thereunder. Accordingly, a depletion region may be formed in the 2DEG layer 430 under the depletion formation pattern 442. That is, the 2DEG layer 430 may be broken (i.e., the 2DEG layer 430 may not be present) in an area adjacent to the depletion formation pattern 442. Accordingly, the HEMT device 400 may have a normally-off characteristic.

The depletion formation pattern 442 may include a p-type semiconductor layer or a layer doped with a p-type dopant (i.e., a p-doped layer). Also, the depletion formation pattern 442 may include a III-V-based nitride semiconductor. For example, the depletion formation pattern 442 may include at least one of GaN, AlGaN, InN, AlInN, InGaN, and AlInGaN and may be doped with a p-type dopant, such as Mg. As a practical example, the depletion formation pattern 442 may include a p-GaN layer or a p-AlGaN layer.

The gate electrode G may be provided on the depletion formation pattern 442. The gate electrode G may include various metals or metal compounds. The source electrode S and the drain electrode D may be provided on the channel supply layer 420 on opposite sides of the gate electrode G. The source electrode S and the drain electrode D may be electrically connected to the 2DEG layer 430. The source electrode S and the drain electrode D may be in ohmic contact with the channel supply layer 420. In an example embodiment, an ohmic contact layer may further be provided between the source electrode S and the channel supply layer 420 and between the drain electrode D and the channel supply layer 420.

The first insulating patterns IP1 respectively may be provided on side surfaces of the HEMT device 400. The first insulating patterns IP1 may extend from a height equal to that of a bottom surface of the channel layer 410 to a height equal to that of an upper surface of the channel supply layer 420 in a second direction DR2 as shown in FIG. 1. The first insulating patterns IP1 may be provided on the separation layer 300. The first insulating patterns IP1 may overlap the separation layer 300 in the second direction DR2 perpendicular to the upper surface 100u of the substrate 100. Bottom surfaces of the first insulating patterns IP1 may be coplanar with the bottom surface of the channel layer 410. A thickness of one region of the separation layer 300 overlapping the channel layer 410 in the second direction DR2 may be substantially the same as the thickness of the other area of the separation layer 300 overlapping the first insulating patterns IP1 in the second direction DR2. The first insulating patterns IP1 may be formed by implanting first dopants into the channel supply layer 420 and the channel layer 410. For example, the first dopant may include argon (Ar).

The light-emitting device 200 may be provided on the second region R2. For example, the light-emitting device 200 may include a micro-LED. The light-emitting device 200 may include a lower semiconductor layer 210, an active layer 220, an upper semiconductor layer 230, and an anode AE.

The lower semiconductor layer 210 may include a III-V compound semiconductor having a first conductivity type. For example, the lower semiconductor layer 210 may include n-type GaN. The lower semiconductor layer 210 may extend between the substrate 100 and the separation layer 300 in the first direction DR1. In other words, the lower semiconductor layer 210 may extend along surfaces of the substrate 100 and the separation layer 300 that are parallel to the first direction DR1.

The upper semiconductor layer 230 may be provided on the lower semiconductor layer 210. The upper semiconductor layer 230 may include a III-V compound semiconductor having a second conductivity type, the second conductivity type being different from the first conductivity type. For example, the upper semiconductor layer 230 may include p-type GaN.

The active layer 220 may be provided between the lower semiconductor layer 210 and the upper semiconductor layer 230. The active layer 220 may generate light by using electrons and holes provided from the lower semiconductor layer 210 and the upper semiconductor layer 230. The active layer 220 may include a single quantum well (SQW), a multi quantum well (MQW), super lattices (SLs), or a combination thereof. For example, the active layer 220 may include $In_xGa_{1-x}N/GaN$ ($0 \le x < 1$).

The anode AE may be provided on the upper semiconductor layer 230. The anode AE may be electrically connected to the upper semiconductor layer 230. In example embodiments, the drain electrode D may be electrically connected to the anode AE. In this case, the HEMT device 400 may be a driving device for operating the light-emitting device 200. The anode AE may include substantially the same material as the gate electrode G, the source electrode S, and the drain electrode D. For example, the anode AE may include a metal or a metal compound.

The second insulating patterns IP2 respectively may be provided on side surfaces of the light-emitting device 200. The second insulating patterns IP2 may extend from a height equal to that of a bottom surface of the active layer 220 to a height equal to that of an upper surface of the upper semiconductor layer 230 in the second direction DR2. The second insulating patterns IP2 may be provided on the lower semiconductor layer 210. The second insulating patterns IP2 may overlap the lower semiconductor layer 210 in the second direction DR2. Bottom surfaces of the second insulating patterns IP2 may be coplanar with the bottom surface of the active layer 220. A thickness of one region of the lower semiconductor layer 210 overlapping the active layer 220 in the second direction DR2 may be substantially the same as the thickness of the other area of the lower semiconductor layer 210 overlapping the second insulating patterns IP2 in the second direction DR2. The second insulating patterns IP2 may be formed by implanting a second dopant into the upper semiconductor layer 230 and the active layer 220. The second dopant may be substantially the same as the first dopant. For example, the second impurity may include argon (Ar).

An upper spacer layer 250 may be provided between the separation layer 300 and the lower semiconductor layer 210. The upper spacer layer 250 may overlap the upper semiconductor layer 230 in the first direction DR1. The upper spacer layer 250 may have a thickness that is substantially the same as that of the upper semiconductor layer 230. The upper spacer layer 250 may include substantially the same material as that of the upper semiconductor layer 230. For example, the upper spacer layer 250 may include p-type GaN.

The lower spacer layer 240 may be provided between the upper spacer layer 250 and the lower semiconductor layer 210. The lower spacer layer 240 may overlap the active layer 220 in the first direction DR1. The lower spacer layer 240 may have substantially the same thickness as that of the active layer 220. The lower spacer layer 240 may include substantially the same material as that of the active layer 220. The lower spacer layer 240 may include an SQW, an MQW, SLs, or a combination thereof. For example, the lower spacer layer 240 may include $In_xGa_{1-x}N/GaN$ (0≤x<1).

A passivation layer 450 may be provided on the HEMT device 400, the first insulating patterns IP1, and the second insulating patterns IP2. The passivation layer 450 may expose the source electrode S, the drain electrode D, the gate electrode G, the anode AE, and the upper semiconductor layer 230. The passivation layer 450 may include an insulating material. For example, the passivation layer 450 may include silicon oxide or silicon nitride. The passivation layer 450 may have a single layer structure or a multi-layer structure.

The disclosure may provide the semiconductor device 11 in which HEMT devices 400 and light-emitting devices 200 different from each other are monolithically integrated on a single substrate 100.

FIGS. 2, 3, 4, and 5 are diagrams for explaining methods of manufacturing the semiconductor device described with reference to FIG. 1.

Figure 2:
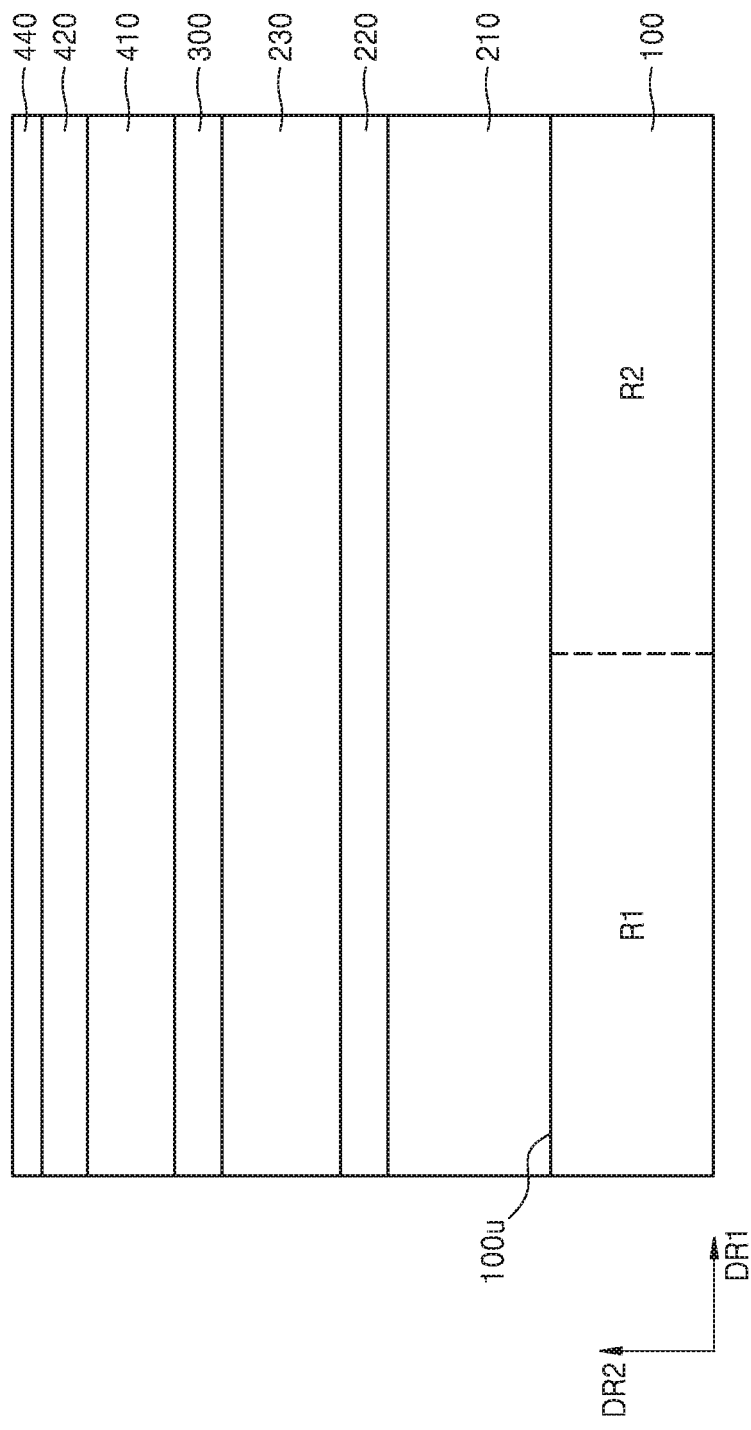
FIG. 2 is a diagram for explaining a method of manufacturing the semiconductor device described with reference to FIG. 1.

Referring to FIG. 2, the substrate 100 may be prepared. The substrate 100 may include the first region R1 and the second region R2. The first region R1 and the second region R2 may be arranged in the first direction DR1 parallel to the upper surface 100u of the substrate 100.

The lower semiconductor layer 210, the active layer 220, the upper semiconductor layer 230, the separation layer 300, the channel layer 410, the channel supply layer 420, and a depletion formation layer 440 are sequentially stacked on the substrate 100. For example, the lower semiconductor layer 210, the active layer 220, the upper semiconductor layer 230, the separation layer 300, the channel layer 410, the channel supply layer 420, and the depletion formation layer 440 may be formed by using an epitaxial growth process. The lower semiconductor layer 210, the active layer 220, the upper semiconductor layer 230, the separation layer 300, the channel layer 410, the channel supply layer 420, and the depletion formation layer 440 may overlap both the first region R1 and the second region R2 in the second direction DR2, which is perpendicular to the upper surface 100u of the substrate 100.

The lower semiconductor layer 210 may include a III-V compound semiconductor having a first conductivity type. For example, the lower semiconductor layer 210 may include n-type GaN.

The active layer 220 may include an SQW, an MQW, SLs, or a combination thereof. For example, the active layer 220 may include $In_xGa_{1-x}N/GaN$ (0≤x<1).

The upper semiconductor layer 230 may include a III-V compound semiconductor having a second conductivity type, the second conductivity type being different from the first conductivity type. For example, the upper semiconductor layer 230 may include p-type GaN.

The separation layer 300 may include an insulating material. For example, the separation layer 300 may include undoped GaN or carbon doped GaN.

The channel layer 410 may include a III-V group compound semiconductor. For example, the channel layer 410 may include GaN.

The channel supply layer 420 may include one or more materials selected from dopants including at least one of Al, Ga, In, and B. For example, the channel supply layer 420 may include at least one of AlGaN, AlInN, InGaN, AlN, and AlInGaN.

The depletion formation layer 440 may include a p-type semiconductor layer or a layer doped with a p-type dopant (i.e., a p-doped layer). Also, the depletion formation layer 440 may include a III-V-based nitride semiconductor. For example, the depletion formation layer 440 may include at least one of GaN, AlGaN, InN, AlInN, InGaN, and AlInGaN and may be doped with a p-type dopant, such as Mg. As a practical example, the depletion formation layer 440 may include a p-GaN layer or a p-AlGaN layer.

Figure 3:
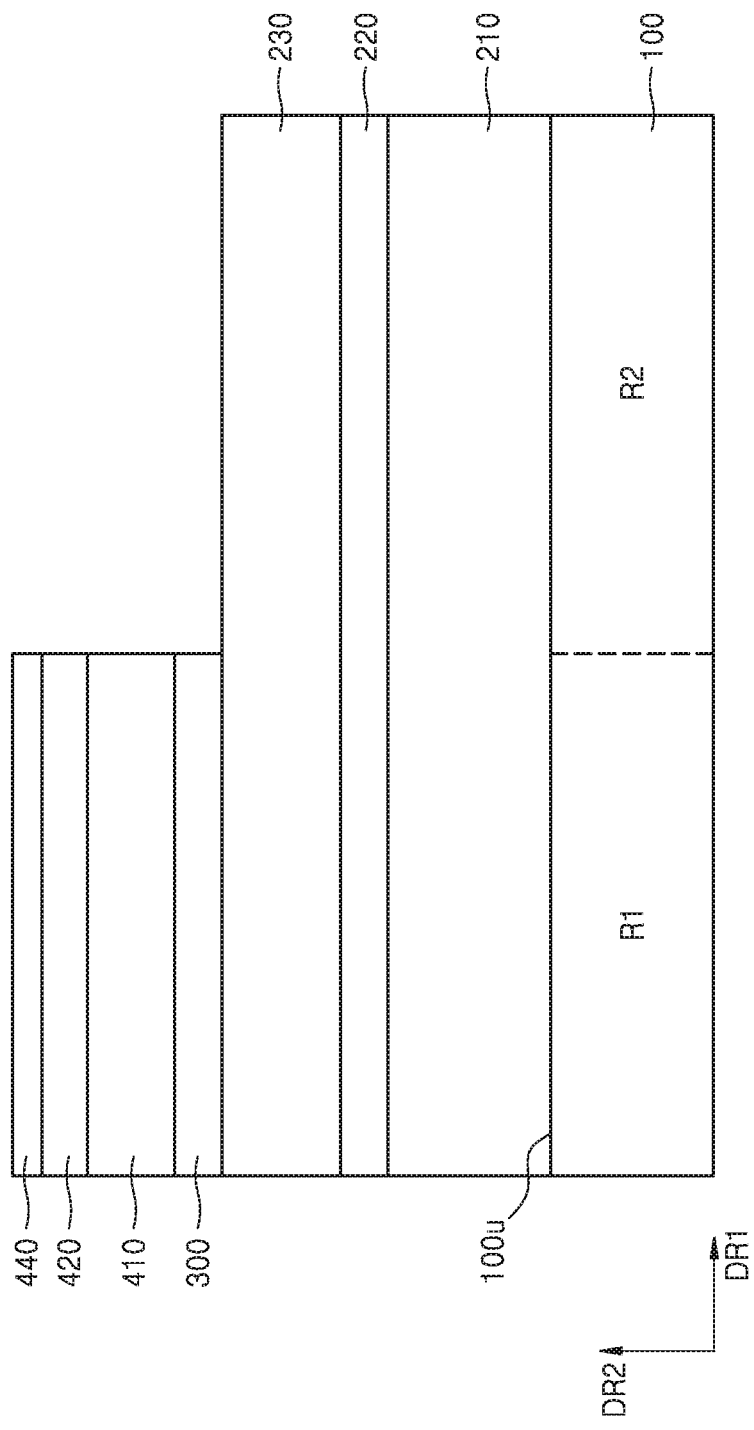
FIG. 3 is a diagram for explaining a method of manufacturing the semiconductor device described with reference to FIG. 1.

Referring to FIG. 3, the depletion formation layer 440, the channel supply layer 420, the channel layer 410, and the separation layer 300 may be patterned. Portions of the depletion formation layer 440, the channel supply layer 420, the channel layer 410, and the separation layer 300 that overlap the second region R2 in the second direction DR2 may be removed. For example, the portions may be removed by performing a selective etching process with respect to the portions. For example, the selective etching process may include a selective inductive coupled plasma etching process. The separation layer 300 overlapping the first region R1 may expose the upper semiconductor layer 230. In other words, etching the portion of the separation layer 300 overlapping the second region R2 may expose the upper semiconductor layer 230.

Figure 4:
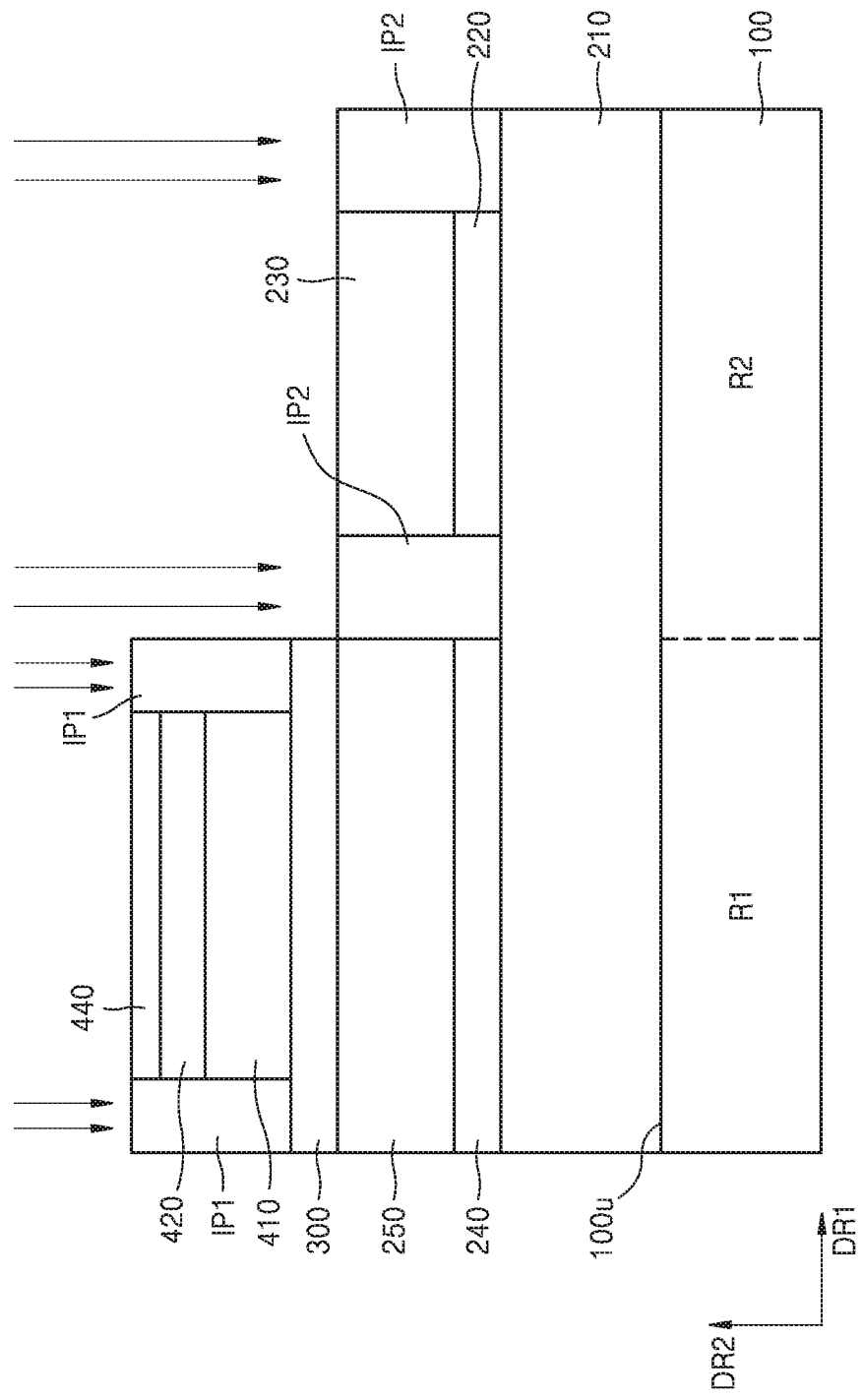
FIG. 4 is a diagram for explaining a method of manufacturing the semiconductor device described with reference to FIG. 1.

Referring to FIG. 4, the first insulation patterns IP1 may be formed by implanting a first dopant into regions adjacent to boundaries of the depletion formation layer 440, the channel supply layer 420, and the channel layer 410 of the first region R1. For example, the process of implanting the first dopant may include an ion implantation process. The process of implanting the first dopant may be performed to the bottom surface of the channel layer 410. That is, the first dopant may be implanted from an upper surface of the depletion formation layer 440 to a bottom surface of the channel layer 410. For example, the first dopant may include argon (Ar).

The second insulating patterns IP2 may be formed by implanting a second dopant into the upper semiconductor layer 230 and the active layer 220 of the second region R2. The second dopant may be implanted in regions adjacent to boundaries of the upper semiconductor layer 230 and the active layer 220 of the second region R2. For example, the process of implanting the second dopant may include an ion implantation process. The process of implanting the second dopant may be performed to a height equal to that of a bottom surface of the active layer 220. That is, the second dopant may be implanted from a height equal to that of an upper surface of the upper semiconductor layer 230 to the height equal to that of the bottom surface of the active layer 220. For example, the second dopant may include argon (Ar). In one example, the process of implanting the first dopant may be simultaneously performed. with the process of implanting the second dopant The upper semiconductor layer 230 and the active layer 220 on the first region R1 respectively may be referred to as the upper spacer layer 250 and the lower spacer layer 240.

Figure 5:
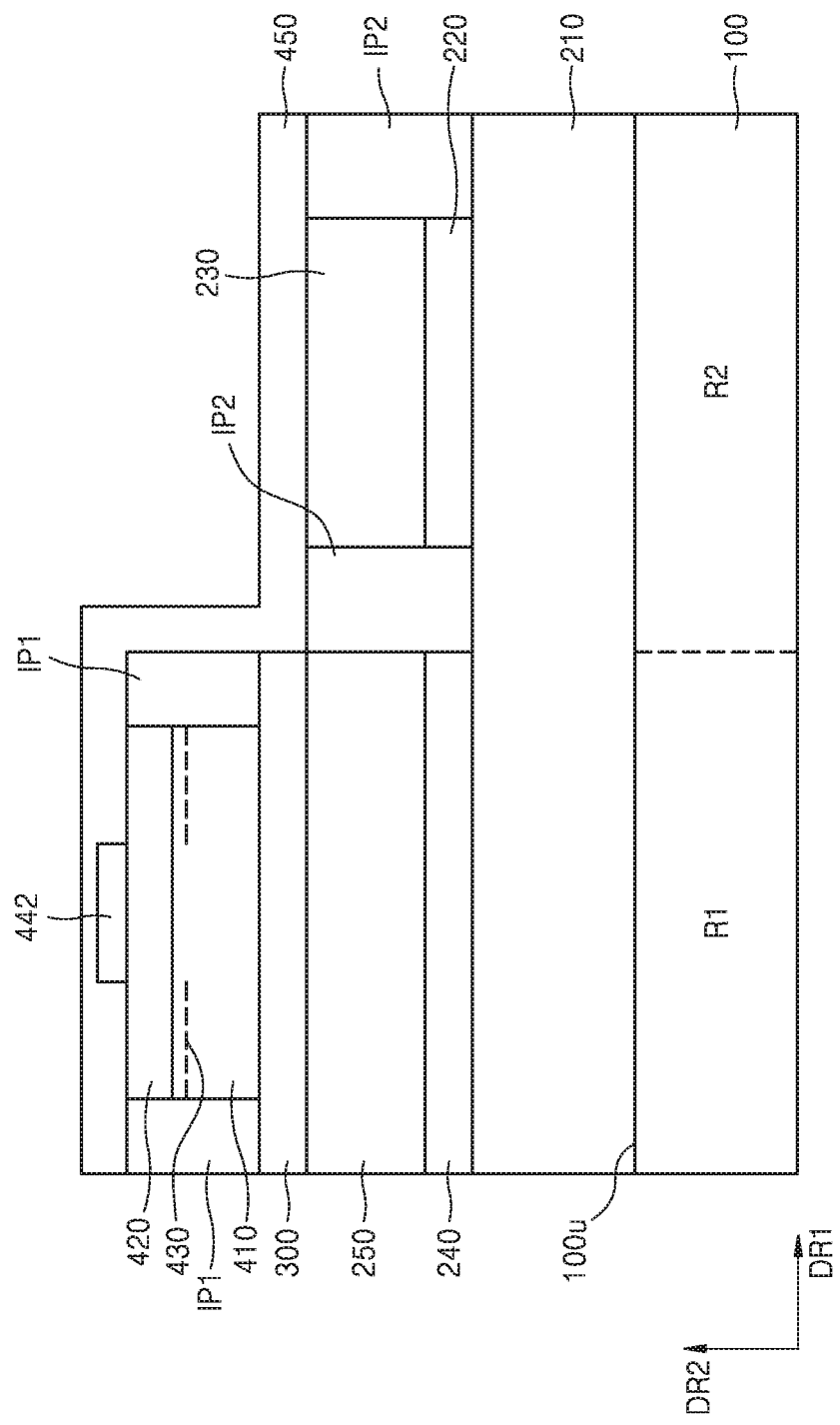
FIG. 5 is a diagram for explaining a method of manufacturing the semiconductor device described with reference to FIG. 1.

Referring to FIG. 5, the depletion formation pattern 442 may be formed on the channel supply layer 420. For example, the process of forming the depletion formation pattern 442 may include patterning the depletion formation layer 440 (refer to FIG. 4) by performing an etching process using an etching mask on the depletion formation layer 440 (refer to FIG. 4). The depletion formation pattern 442 may expose an upper surface of the channel supply layer 420. The etching mask may be removed after or during the etching process.

The passivation layer 450 may be formed on the channel supply layer 420, the depletion formation pattern 442, the upper semiconductor layer 230, the first insulation patterns IP1, and the second insulation patterns IP2. For example, the passivation layer 450 may be formed by using a chemical vapor deposition (CVD) process, a physical vapor deposition (PVD) process, or an atomic layer deposition (ALD) process. The passivation layer 450 may extend along surfaces of the channel supply layer 420, the depletion formation pattern 442, the upper semiconductor layer 230, the first insulating patterns IP1, and the second insulating patterns IP2.

Referring again to FIG. 1, a source electrode S, a drain electrode D, a gate electrode G, and an anode AE may be formed. The forming of the source electrode S, the drain electrode D, the gate electrode G, and the anode AE may include forming openings that expose the channel supply layer 420, the depletion formation pattern 442, and the upper semiconductor layer 230 by patterning the passivation layer 450, forming a conductive material film that fills the openings on the passivation layer 450, and exposing the passivation layer 450 between the openings by patterning the conductive material film.

The source electrode S and the drain electrode D may be formed to be separated from each other in the first direction DR1 with the depletion formation pattern 442 therebetween. The source electrode S and the drain electrode D may extend through the passivation layer 450. Bottom surfaces of each of the source electrode S and the drain electrode D may be in contact with the channel supply layer 420. Upper surfaces of each of the source electrode S and the drain electrode D may be exposed by the passivation layer 450.

The gate electrode G may be formed on the depletion formation pattern 442. The gate electrode G may be formed between the source electrode S and the drain electrode D in the first direction DR1.

The anode AE may fill a portion of the opening exposing the upper semiconductor layer 230. The anode AE may be formed on the edges of upper surfaces of the upper semiconductor layer 230 and the second insulating pattern IP2 immediately adjacent to each other. A portion of the bottom surface of the anode AE may be in contact with the upper semiconductor layer 230, and the other portion thereof may be in contact with the second insulating pattern IP2.

The lower semiconductor layer 210, the active layer 220, the upper semiconductor layer 230, and the anode AE formed on the second region R2 may form the light-emitting device 200 (refer to FIG. 1). The channel layer 410, the channel supply layer 420, the depletion formation pattern 442, the gate electrode G, the source electrode S, and the drain electrode D on the first region R1 may form the HEMT device 400 (refer to FIG. 1).

Embodiments may provide a method of manufacturing a semiconductor device in which the light-emitting device 200 (refer to FIG. 1) and the HEMT device 400 (refer to FIG. 1) are monolithically formed on a single substrate 100.

Figure 6:
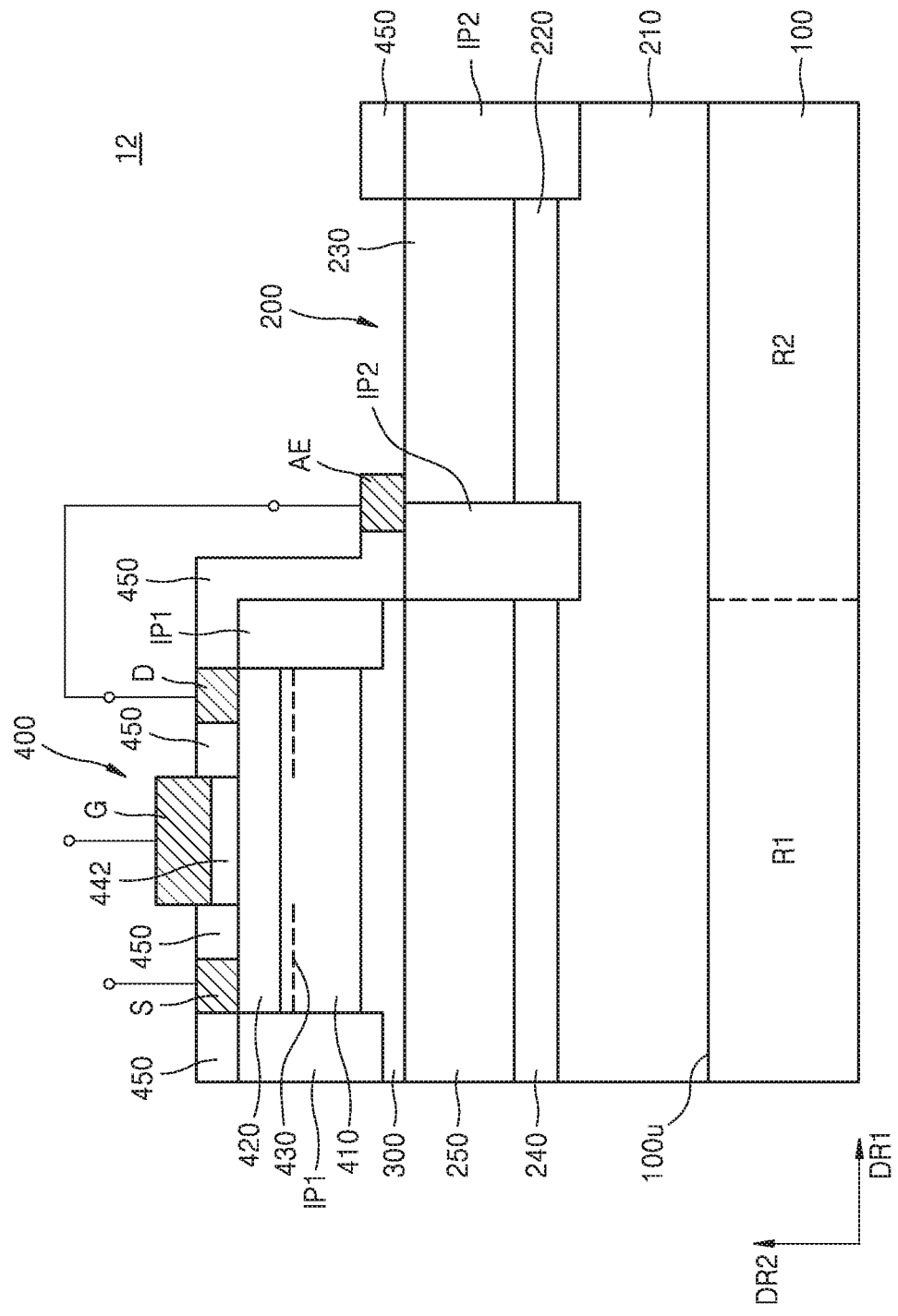
FIG. 6 is a diagram illustrating a semiconductor device according to an example embodiment.

FIG. 6 is a diagram illustrating a semiconductor device 12 according to embodiments. For brevity of description, substantially the same descriptions given with reference to FIG. 1 may be omitted.

Referring to FIG. 6, a semiconductor device 12 including a substrate 100, an HEMT device 400, a light-emitting device 200, first insulating patterns IP1, and second insulating patterns IP2 may be provided.

A thickness of one region of the separation layer 300 overlapping the channel layer 410 in the second direction DR2 may be greater than a thickness of other areas of the separation layer 300 overlapping the first insulating patterns IP1 in the second direction DR2. As shown in FIG. 6, an upper portion of the separation layer 300 may overlap lower portions of the first insulating patterns IP1 in the first direction DR1. The upper surface of the separation layer 300 may have a step difference. The upper surface of one region of the separation layer 300 may be at a level higher than that of another region of the upper surface of the separation layer 300. The upper surface of one region of the separation layer 300 may be an uppermost surface of the separation layer 300. A distance between the upper surface of the one region of the separation layer 300 and the upper surface 100u of the substrate 100 may be greater than a distance between the upper surface of the other region of the separation layer 300 and the upper surface 100u of the substrate 100.

A thickness of one region of the lower semiconductor layer 210 overlapping the active layer 220 in the second direction DR2 may be greater than a thickness of other regions of the lower semiconductor layer 210 overlapping the second insulating patterns IP2 in the second direction DR2. As shown in FIG. 6, an upper portion of the lower semiconductor layer 210 may overlap lower portions of the second insulating patterns IP2 in the first direction DR1. The upper surface of the lower semiconductor layer 210 may have a step difference. An upper surface of one region of the lower semiconductor layer 210 may be at a level higher than that of an upper surface of another region of the lower semiconductor layer 210. The upper surface of one region of the lower semiconductor layer 210 may be an uppermost surface of the lower semiconductor layer 210. A distance between the upper surface of the one region of the lower semiconductor layer 210 and the upper surface 100u of the substrate 100 may be greater than a distance between an upper surface of the other region of the lower semiconductor layer 210 and the upper surface 100u of the substrate 100.

Embodiments may provide a semiconductor device 12 in which the HEMT device 400 and the light-emitting device 200 different from each other are monolithically integrated on a single substrate 100.

Figure 7:
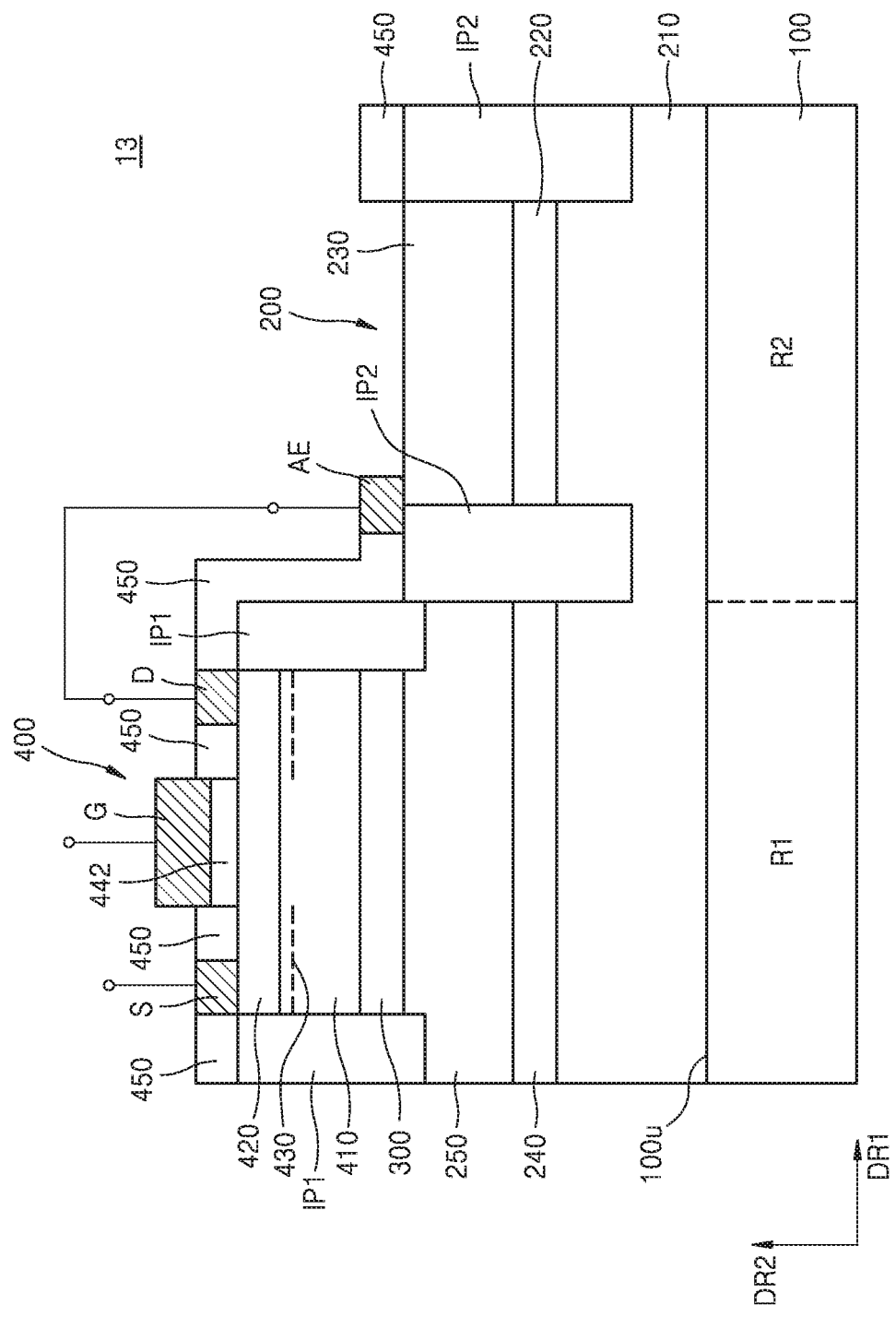
FIG. 7 is a diagram illustrating a semiconductor device according to an example embodiment.

FIG. 7 is a diagram illustrating a semiconductor device 13 according to embodiments. For brevity of description, substantially the same descriptions given with reference to FIG. 1 may be omitted.

Referring to FIG. 7, the semiconductor device 13 including a substrate 100, an HEMT device 400, a light-emitting device 200, first insulating patterns IP1, and second insulating patterns IP2 may be provided.

The first insulating patterns IP1 may extend through the separation layer 300 to contact the upper spacer layer 250. Lower portions of the first insulating patterns IP1 may overlap the upper portions of the upper spacer layer 250 in the first direction DR1. Bottom surfaces of the first insulating patterns IP1 may be at a level lower than that of an upper surface of the upper spacer layer 250. The uppermost surface of the upper spacer layer 250 may be an upper surface of one region of the upper spacer layer 250 overlapping the separation layer 300 in the second direction DR2. A distance between the bottom surfaces of the first insulating patterns IP1 and the upper surface 100u of the substrate 100 may be less than a distance between the upper surface of the upper spacer layer 250 and the upper surface 100u of the substrate 100.

The second insulating patterns IP2 may not extend through the entire lower semiconductor layer 210. That is, a bottom surface of the second insulating pattern IP2 may be between an upper surface and a bottom surface of the lower semiconductor layer 210. A thickness of one region of the lower semiconductor layer 210 overlapping the active layer 220 in the second direction DR2 may be greater than a thickness of other regions of the lower semiconductor layer 210 overlapping the second insulating patterns IP2 in the second direction DR2. An upper portion of the lower semiconductor layer 210 may overlap lower portions of the second insulating patterns IP2 in the first direction DR1. An upper surface of one region of the lower semiconductor layer 210 may be at a level higher than that of an upper surface of another region of the lower semiconductor layer 210. A distance between the upper surface of one region of the lower semiconductor layer 210 and the upper surface 100u of the substrate 100 may be greater than a distance between the upper surface of the other region of the lower semiconductor layer 210 and the upper surface 100u of the substrate 100.

Lower portions of the first insulating patterns IP1 and upper portions of the second insulating patterns IP2 may overlap each other in the first direction DR1. As shown in FIG. 7, the lower portion of the first insulating pattern IP1 and the upper portion of the second insulating pattern IP2 directly adjacent to each other may directly contact each other. In example embodiments, the first insulating pattern IP1 and the second insulating pattern IP2 directly contacting each other may be a single structure. In other words, the first insulating pattern IP1 and the second insulating pattern IP2 directly contacting each other may be connected to each other without an interface therebetween.

Embodiments may provide the semiconductor device 13 in which HEMT devices 400 and light-emitting devices 200 different from each other may be monolithically integrated on a single substrate 100.

Figure 8:
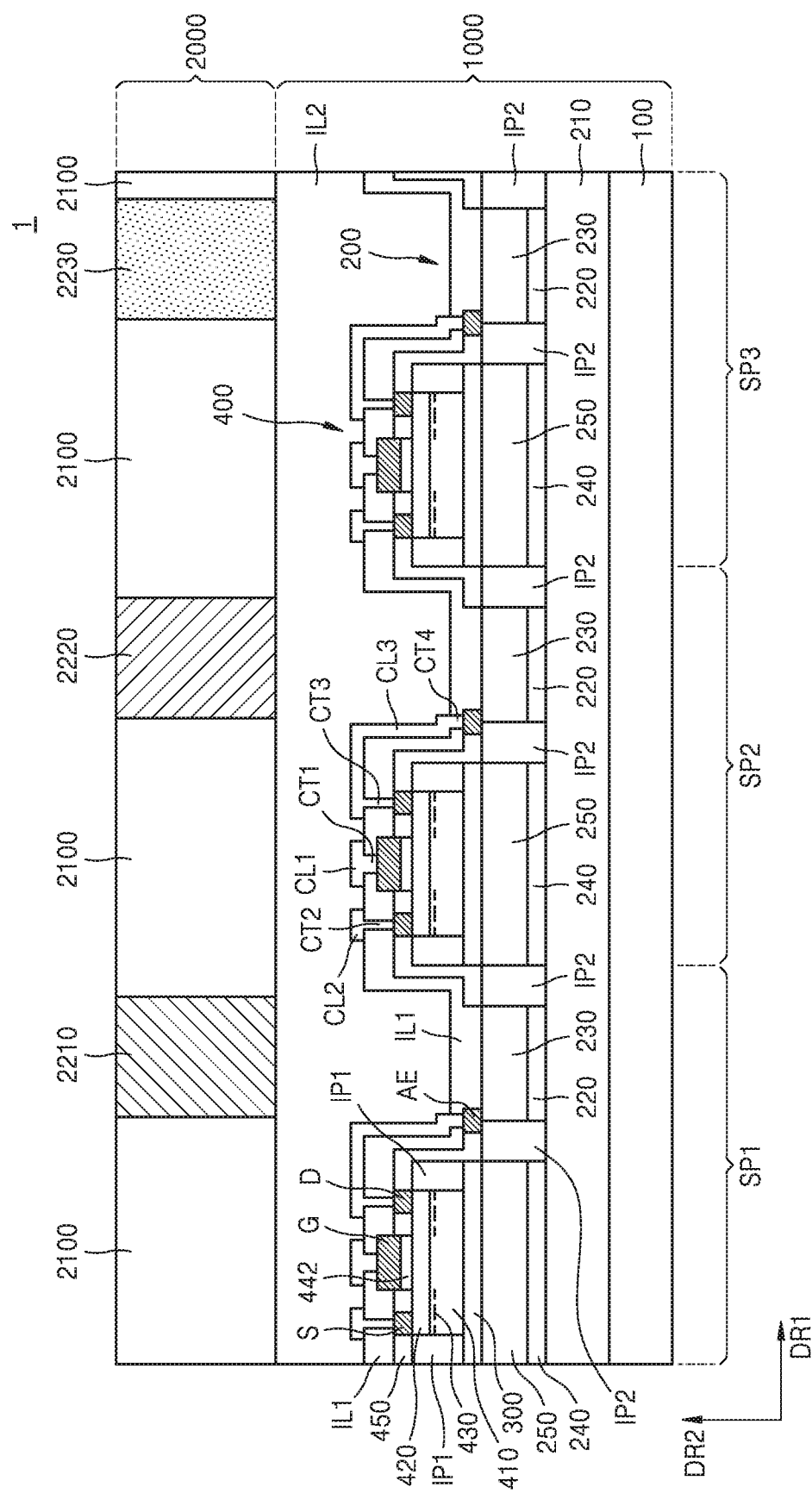
FIG. 8 is a diagram illustrating a display device according to an example embodiment.

FIG. 8 is a diagram illustrating a display device 1 according to embodiments. For brevity of description, substantially the same descriptions given with reference to FIG. 1 may be omitted.

Referring to FIG. 8, the display device 1 including a composite layer 1000 and a light control layer 2000 may be provided. The display device 1 may include a plurality of pixels. However, for convenience of explanation, one pixel is shown. The pixel may include a first sub-pixel SP1, a second sub-pixel SP2, and a third sub-pixel SP3 that respectively emit light of different colors. For example, the first through third sub-pixels SP1, SP2, and SP3 respectively may emit red light, green light, and blue light.

The composite layer 1000 may include a substrate 100, light-emitting devices 200, lower spacer layers 240, upper spacer layers 250, separation layers 300, HEMT devices 400, first insulating patterns IP1, second insulating patterns IP2, a lower insulating layer IL1, first through fourth contacts CT1, CT2, CT3, and CT4, first through third wirings CL1, CL2, and CL3, and an upper insulating layer IL2. The substrate 100, the light-emitting devices 200, the lower spacer layers 240, the upper spacer layers 250, the separation layers 300, the HEMT devices 400, the first insulating patterns IP1, and the second insulating patterns IP2 may be substantially the same as those described with reference to FIG. 1. However, the substrate 100 and the lower semiconductor layer 210 may extend to cross the first through third sub-pixels SP1, SP2, and SP3. In an example embodiment, the substrate 100, the light-emitting devices 200, the lower spacer layers 240, the upper spacer layers 250, the separation layers 300, the HEMT devices 400, the first insulating patterns IP1, and the second insulating patterns IP2 may be substantially the same as those described with reference to FIG. 6 or 7.

The lower insulating layer IL1 may be provided on the passivation layer 450. The lower insulating layer IL1 may extend along a surface of the passivation layer 450. The lower insulating layer IL1 may cover an upper surface of the upper semiconductor layer 230 on the light-emitting device 200. For example, the lower insulating layer IL1 may directly contact the upper surface of the upper semiconductor layer 230. For example, the lower insulating layer IL1 may include silicon oxide or silicon nitride.

The first contact CT1 and the first wiring CL1 may be provided on a gate electrode G. The first wiring CL1 may be electrically connected to the gate electrode G via the first contact CT1. The first wiring CL1 may transmit a voltage applied to the gate electrode G. For example, when the HEMT device 400 is a driving device for operating the light-emitting device 200, the first wiring CL1 may be electrically connected to a drain electrode of a switching device. The first contact CT1 and the first wiring CL1 may include a conductive material. For example, the first contact CT1 and the first wiring CL1 may include a metal.

The second contact CT2 and the second wiring CL2 may be provided on a source electrode S. The second wiring CL2 may be electrically connected to the source electrode S via the second contact CT2. The second wiring CL2 may transmit a voltage applied to the source electrode S. For example, when the HEMT device 400 is a driving device for operating the light-emitting device 200, the second wiring CL2 may be electrically connected to a power line. The second contact CT2 and the second wiring CL2 may include a conductive material. For example, the second contact CT2 and the second wiring CL2 may include a metal.

The third contact CT3 and the fourth contact CT4 may be provided on a drain electrode D and an anode AE, respectively. The third wiring CL3 may extend from the third contact CT3 to the fourth contact CT4 along an upper surface of the lower insulating layer IL1. The drain electrode D may be electrically connected to the third wiring CL3 via the third contact CT3. The anode AE may be electrically connected to the third wiring CL3 by the fourth contact CT4. Accordingly, the drain electrode D and the anode AE may be electrically connected to each other. For example, the light-emitting device 200 may emit light when a voltage is applied to the anode AE by the third wiring CL3.

The upper insulating layer IL2 may be provided on the lower insulating layer IL1, the first through fourth contacts CT1, CT2, CT3 and CT4, and the first through third wrings CL1, CL2 and CL3. An upper surface of the upper insulating layer IL2 may be flat. For example, the upper surface of the upper insulating layer IL2 may be parallel to the upper surface 100u of the substrate 100. For example, the upper insulating layer IL2 may include silicon oxide or silicon nitride.

The light control layer 2000 may be provided on the upper insulating layer IL2. The light control layer 2000 may include black matrices 2100 and first through third light control patterns 2210, 2220, and 2230 respectively disposed between the black matrices 2100. The first through third light control patterns 2210, 2220, and 2230 may be provided in the first through third sub-pixels SP1, SP2, and SP3, respectively. The first through third light control patterns 2210, 2220, and 2230 may respectively correspond to the light-emitting devices 200.

The first light control pattern 2210 may emit red light by receiving light emitted from the light-emitting device 200 in the first sub-pixel SP1. When the light-emitting device 200 emits blue light, the first light control pattern 2210 may include, for example, quantum dots (hereinafter, QDs) or phosphors that emit red light by being excited by the blue light. The QDs may have a core-shell structure having a core portion and a shell portion, and may also have a particle structure without a shell. The core-shell structure may include a single-shell or a multi-shell. For example, the multi-shell may be a double-shell. In example embodiments, the QDs may include at least one of a II-VI compound semiconductor, a III-V compound semiconductor, a IV-VI compound semiconductor, a Group IV-based semiconductor, and a graphene quantum dot. For example, the QDs may include at least one of Cd, Se, Zn, S, and InP, but is not limited thereto. The QDs may have a diameter of several tens of nm or less. For example, the diameter of the QDs may be about 10 nm or less. The first light control pattern 2210 may further include a photoresist and a light scattering agent.

The second light control pattern 2220 may emit green light by receiving light emitted from the light-emitting device 200 in the second sub-pixel SP2. When the light-emitting device 200 emits blue light, the second light control pattern 2220 may include, for example, QDs or phosphors that emit green light by being excited by the blue light. The second light control pattern 2220 may further include a photoresist and a light scattering agent.

The third light control pattern 2230 may emit light of the same color by receiving light emitted from the light-emitting device 200 in the third sub-pixel SP3. When blue light is emitted from the light-emitting device 200, the third light control pattern 2230 may emit blue light by receiving light emitted from the light-emitting device 200. The third light control pattern 2230 may include a photoresist and a light scattering agent.

Each of the black matrices 2100 may be provided over a pair of sub-pixels (for example, first and second sub-pixels SP1 and SP2 and second and third sub-pixels SP2 and SP3) immediately adjacent to each other. The black matrices 2100 may respectively correspond to the HEMT devices 400. For example, the black matrices 2100 may overlap respective HEMT device 400 in the second direction DR2. The black matrices 2100 may absorb light to prevent crosstalk from occurring between the first through third sub-pixels SP1, SP2, and SP3.

The disclosure may provide the display device 1 including a semiconductor device in which multiple HEMT devices 400 and light-emitting devices 200 different from each other are monolithically integrated on a single substrate 100.

Figure 9:
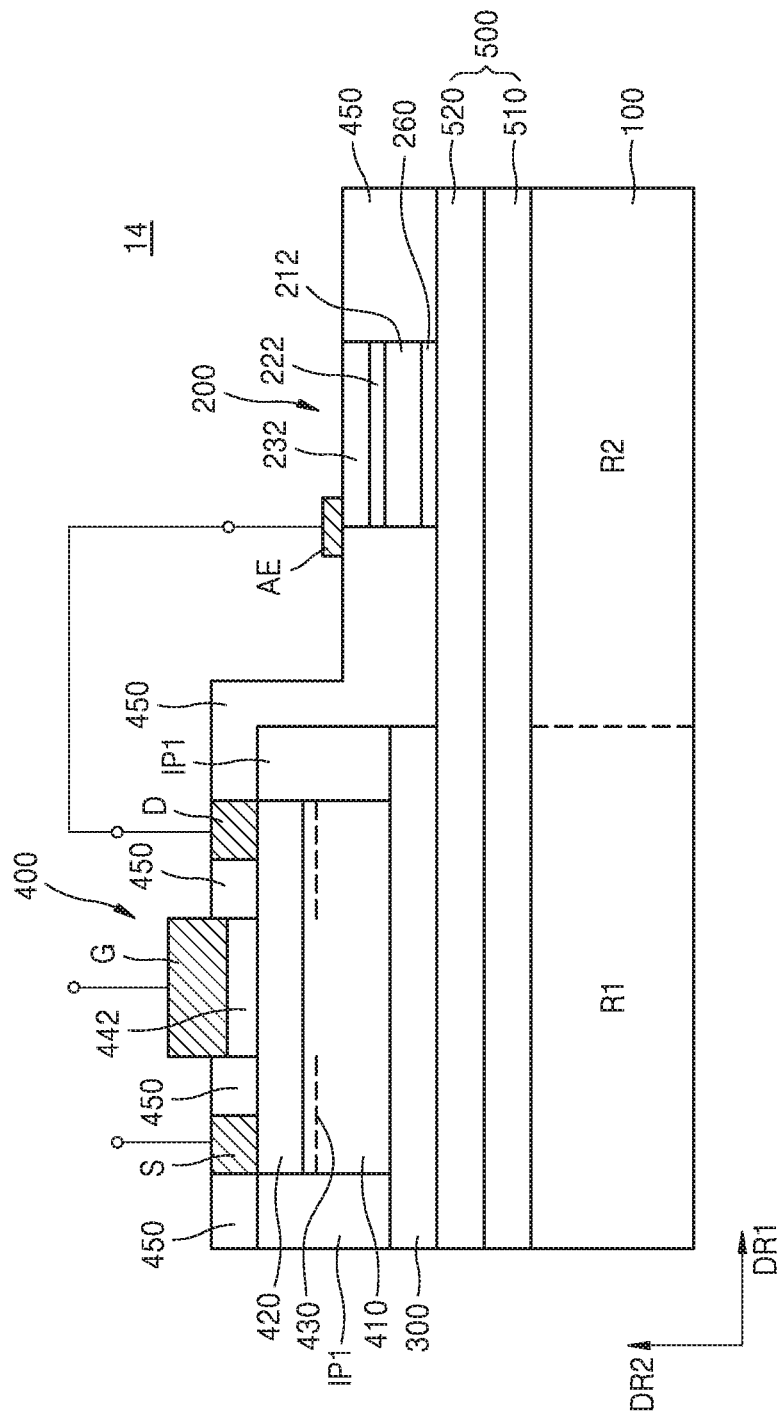
FIG. 9 is a diagram illustrating a semiconductor device according to an example embodiment.

FIG. 9 is a diagram illustrating a semiconductor device 14 according to embodiments. For brevity of description, substantially the same descriptions given with reference to FIG. 1 may be omitted.

Referring to FIG. 9, the semiconductor device 14 including a substrate 100, a light-emitting device 200, a separation layer 300, an HEMT device 400, first insulating patterns IP1, a passivation layer 450, and a seed layer structure 500 may be provided. The substrate 100, the separation layer 300, the HEMT device 400, and the first insulating patterns IP1 may be substantially the same as those described with reference to FIG. 1.

The seed layer structure 500 may be provided between the separation layer 300 and the substrate 100. The seed layer structure 500 may extend in the first direction DR1 along an upper surface of the substrate 100 to cover the first region R1 and the second region R2 of the substrate 100. The seed layer structure 500 may include a lower seed layer 510 and an upper seed layer 520 sequentially stacked on the substrate 100. The lower seed layer 510 may include a III-V compound semiconductor having a first conductivity type. For example, the lower seed layer 510 may include n-type GaN. The upper seed layer 520 may include an intrinsic III-V compound semiconductor. For example, the upper seed layer 520 may include intrinsic GaN.

A seed pattern 260, a lower semiconductor pattern 212, an active pattern 222, and an upper semiconductor pattern 232 sequentially stacked in the passivation layer 450 may be provided. The seed pattern 260, the lower semiconductor pattern 212, the active pattern 222, and the upper semiconductor pattern 232 may collectively extend through the entire passivation layer 450 to directly contact the upper seed layer 520. Each of the seed pattern 260, the lower semiconductor pattern 212, the active pattern 222, and the upper semiconductor pattern 232 may extend in the first direction DR1.

The seed pattern 260 may be for growing the lower semiconductor pattern 212. For example, the seed pattern 260 may include an AlGaN layer and a GaN layer that are sequentially stacked.

The lower semiconductor pattern 212 may include a III-V compound semiconductor having a first conductivity type. For example, the lower semiconductor pattern 212 may include n-type GaN.

The upper semiconductor pattern 232 may be provided on the lower semiconductor pattern 212. An upper surface of the upper semiconductor pattern 232 may be coplanar with an upper surface of the passivation layer 450, which is immediately adjacent. That is, the upper surface of the upper semiconductor pattern 232 may be exposed from the passivation layer 450. The upper semiconductor pattern 232 may include a III-V compound semiconductor having a second conductivity type, the second conductivity type being different from the first conductivity type. For example, the upper semiconductor pattern 232 may include p-type GaN.

The active pattern 222 may be provided between the lower semiconductor pattern 212 and the upper semiconductor pattern 232. The active pattern 222 may generate light by receiving electrons and holes provided from the lower semiconductor pattern 212 and the upper semiconductor pattern 232. The active pattern 222 may include an SQW, an MQW, SLs, or a combination thereof. For example, the active pattern 220 may include $In_xGa_{1-x}N/GaN$ ($0 \leq x < 1$).

An anode AE may be provided on the upper semiconductor pattern 232 and may also extend over the passivation layer 450. The anode AE may overlap both the upper semiconductor pattern 232 and the passivation layer 450 in the second direction DR2. A portion of a bottom surface of the anode AE may directly contact the upper semiconductor pattern 232, and the other portion of the bottom surface may directly contact the passivation layer 450. The anode AE may be electrically connected to a drain electrode D.

The disclosure may provide the semiconductor device 14 in which HEMT devices 400 and light-emitting devices 200 different from each other are monolithically integrated on a single substrate 100.

FIGS. 10, 11, 12, 13, and 14 are diagrams for explaining methods of manufacturing the semiconductor device described with reference to FIG. 9. For brevity of description, substantially the same descriptions given with reference to FIGS. 2 through 5 may be omitted.

Figure 10:
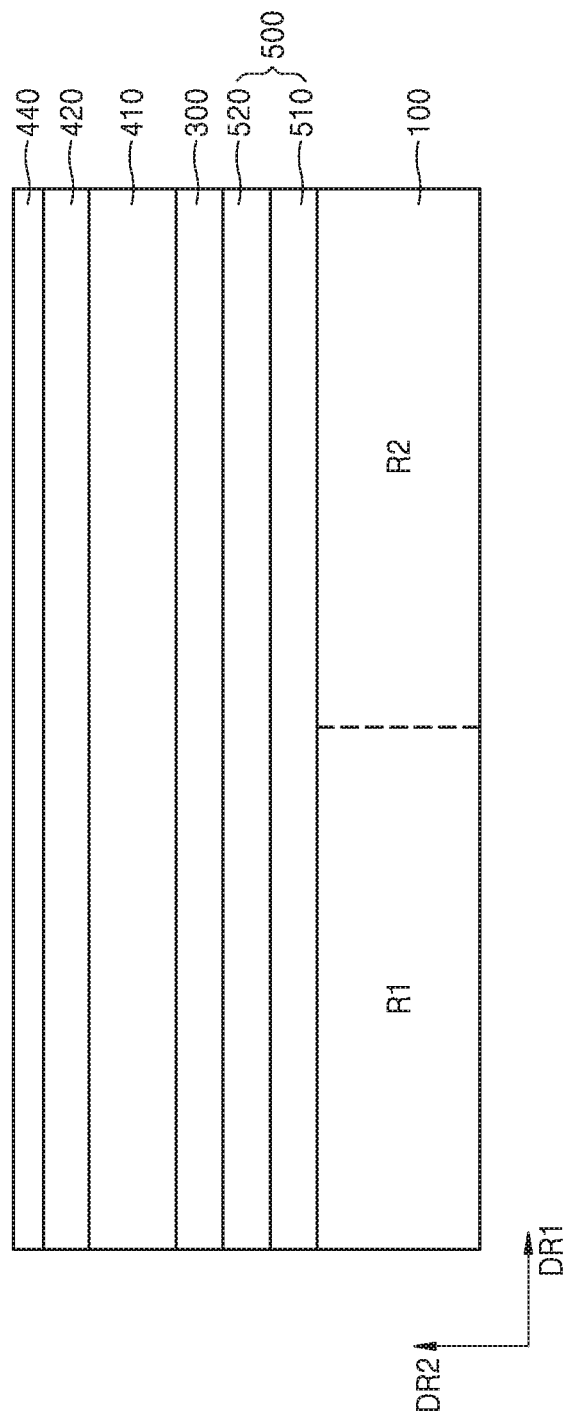
FIG. 10 is a diagram for explaining a method of manufacturing the semiconductor device described with reference to FIG. 9.

Referring to FIG. 10, a substrate 100 may be prepared. The substrate 100 may include a first region R1 and a second region R2. The first region R1 and the second region R2 may be arranged in the first direction DR1 parallel to an upper surface 100u of the substrate 100.

A lower seed layer 510, an upper seed layer 520, a separation layer 300, a channel layer 410, a channel supply layer 420, and a depletion formation layer 440 may be sequentially formed on the substrate 100. For example, the lower seed layer 510, the upper seed layer 520, the separation layer 300, the channel layer 410, the channel supply layer 420, and the depletion formation layer 440 may be epitaxial layers formed by using an epitaxial growth process. The lower seed layer 510, the upper seed layer 520, the separation layer 300, the channel layer 410, the channel supply layer 420, and the depletion formation layer 440 may overlap both the first region R1 and the second region R2 in the second direction DR2.

The lower seed layer 510 may include a III-V compound semiconductor having a first conductivity type. For example, the lower seed layer 510 may include n-type GaN. The upper seed layer 520 may include an intrinsic III-V compound semiconductor. For example, the upper seed layer 520 may include intrinsic GaN.

Figure 11:
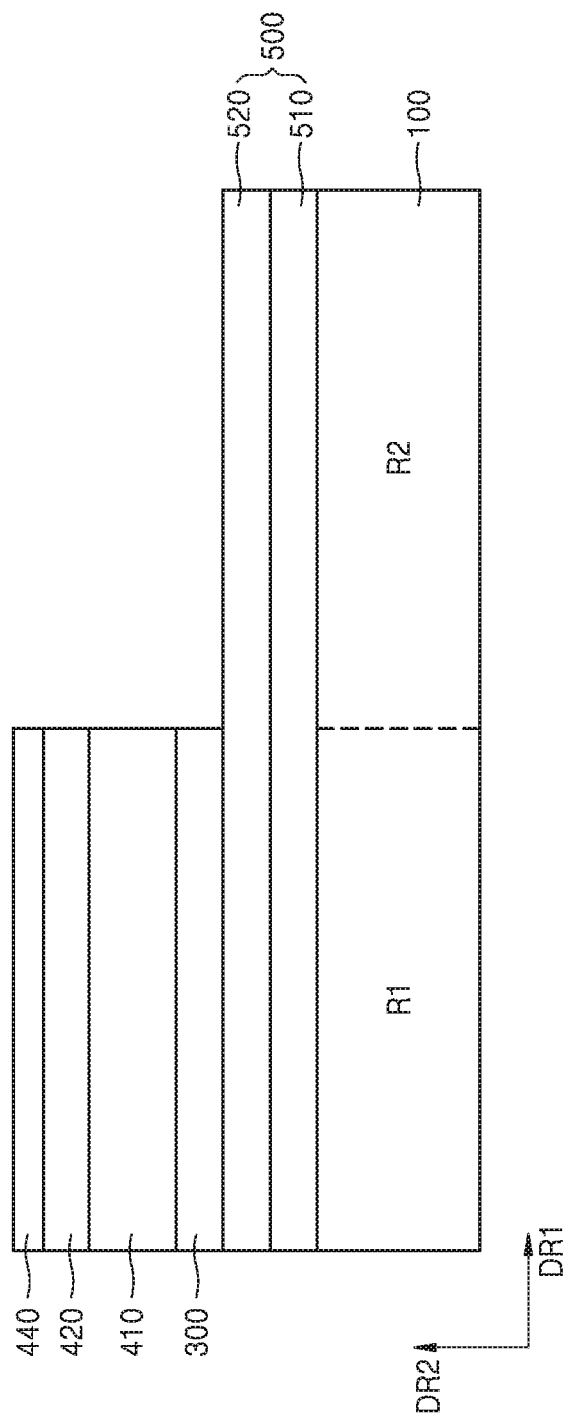
FIG. 11 is a diagram for explaining a method of manufacturing the semiconductor device described with reference to FIG. 9.

Referring to FIG. 11, the depletion formation layer 440, the channel supply layer 420, the channel layer 410, and the separation layer 300 may be patterned. Portions of the depletion formation layer 440, the channel supply layer 420, the channel layer 410, and the separation layer 300 overlapping the second region R2 in the second direction DR2 may be removed. For example, the portions of the depletion formation layer 440, the channel supply layer 420, the channel layer 410, and the separation layer 300 may be removed by performing a selective etching process with respect to the portions. For example, the selective etching process may include a selective inductive coupled plasma etching process. The separation layer 300 overlapping the first region R1 may expose the upper semiconductor layer 230. In other words, etching the portion of the separation layer 300 overlapping the second region R2, which is patterned, may expose the upper seed layer 520.

Figure 12:
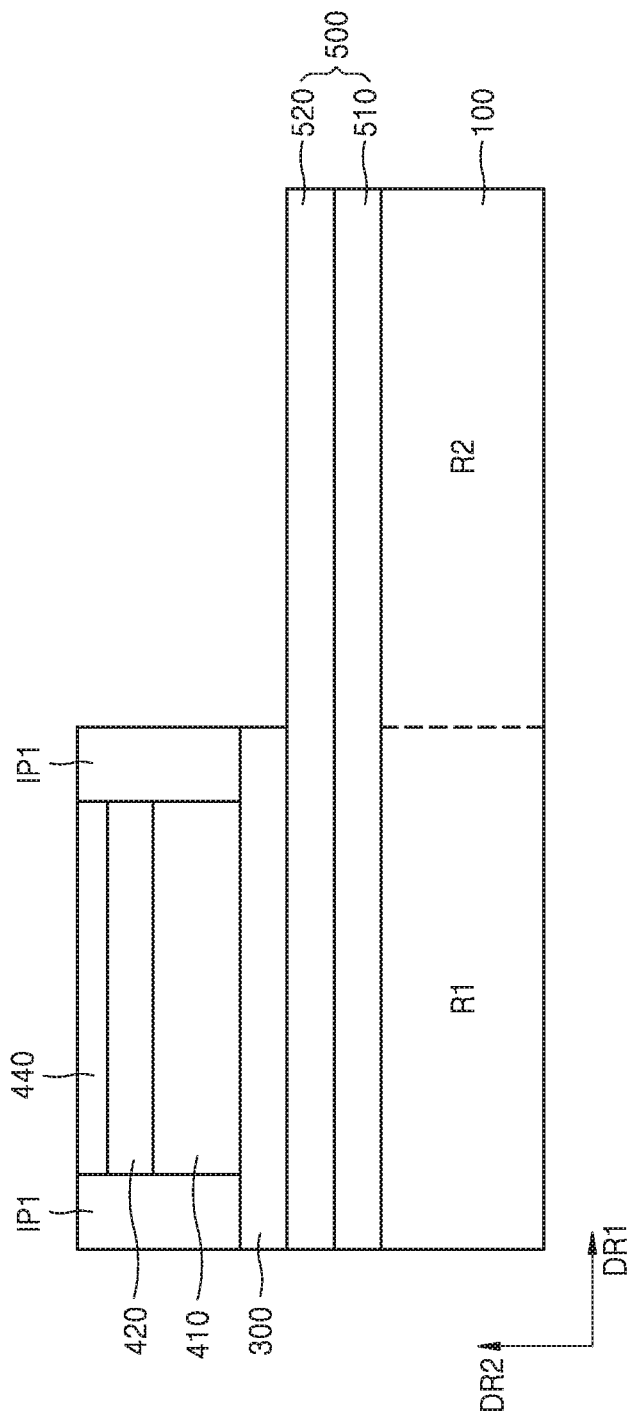
FIG. 12 is a diagram for explaining a method of manufacturing the semiconductor device described with reference to FIG. 9.

Referring to FIG. 12, first insulating patterns IP1 may be formed by implanting dopants into regions of the depletion formation layer 440, the channel supply layer 420, and the channel layer 410 adjacent to boundaries of the first region R1. For example, the process of implanting dopants may include an ion implantation process. The process of implanting dopants may be performed to a bottom surface of the channel layer 410. That is, dopants may be implanted from an upper surface of the depletion formation layer 440 to the bottom surface of the channel layer 410. For example, the dopant may include argon (Ar).

Figure 13:
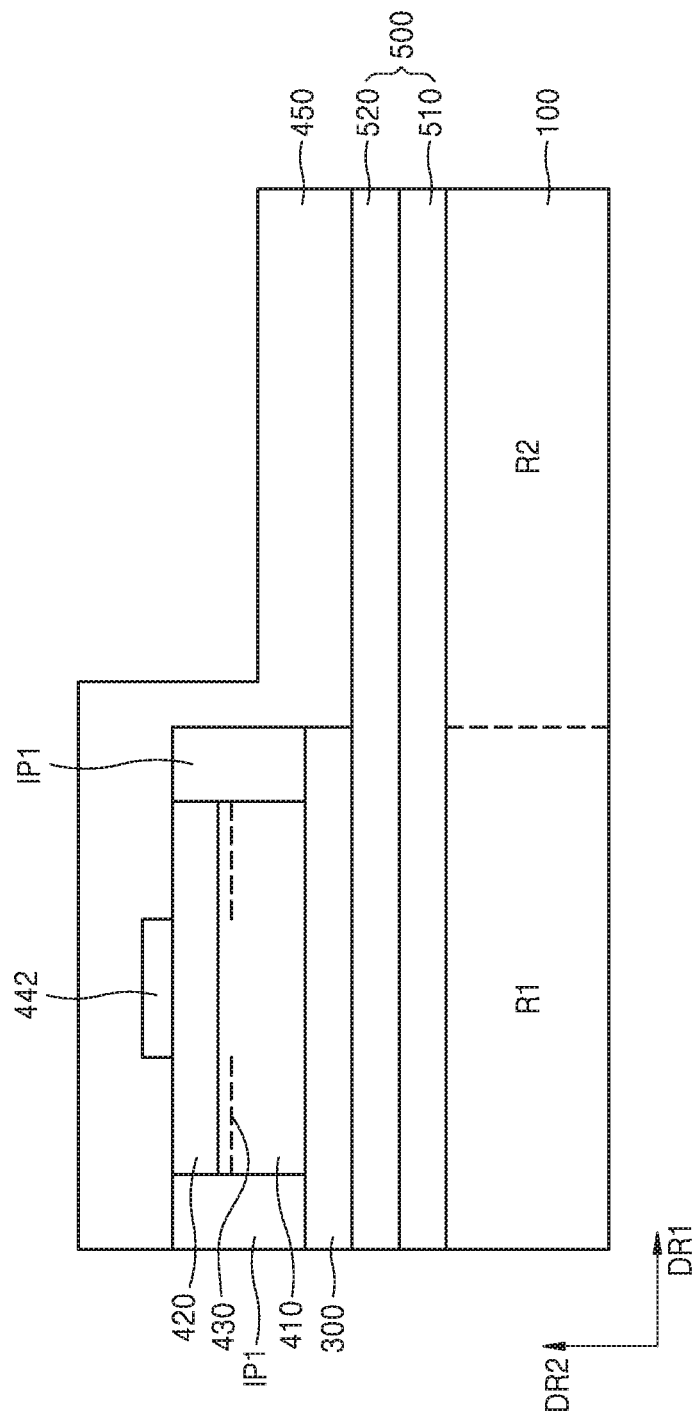
FIG. 13 is a diagram for explaining a method of manufacturing the semiconductor device described with reference to FIG. 9.

Referring to FIG. 13, a depletion formation pattern 442 may be formed on the channel supply layer 420. The forming of the depletion formation pattern 442 may be substantially the same as described with reference to FIG. 5.

A passivation layer 450 may be formed on the channel supply layer 420, the depletion formation pattern 442, the upper seed layer 520, and the first insulating patterns IP1. The passivation layer 450 may extend along surfaces of the depletion formation pattern 442, the channel supply layer 420, the upper seed layer 520, and the first insulating patterns IP1.

Figure 14:
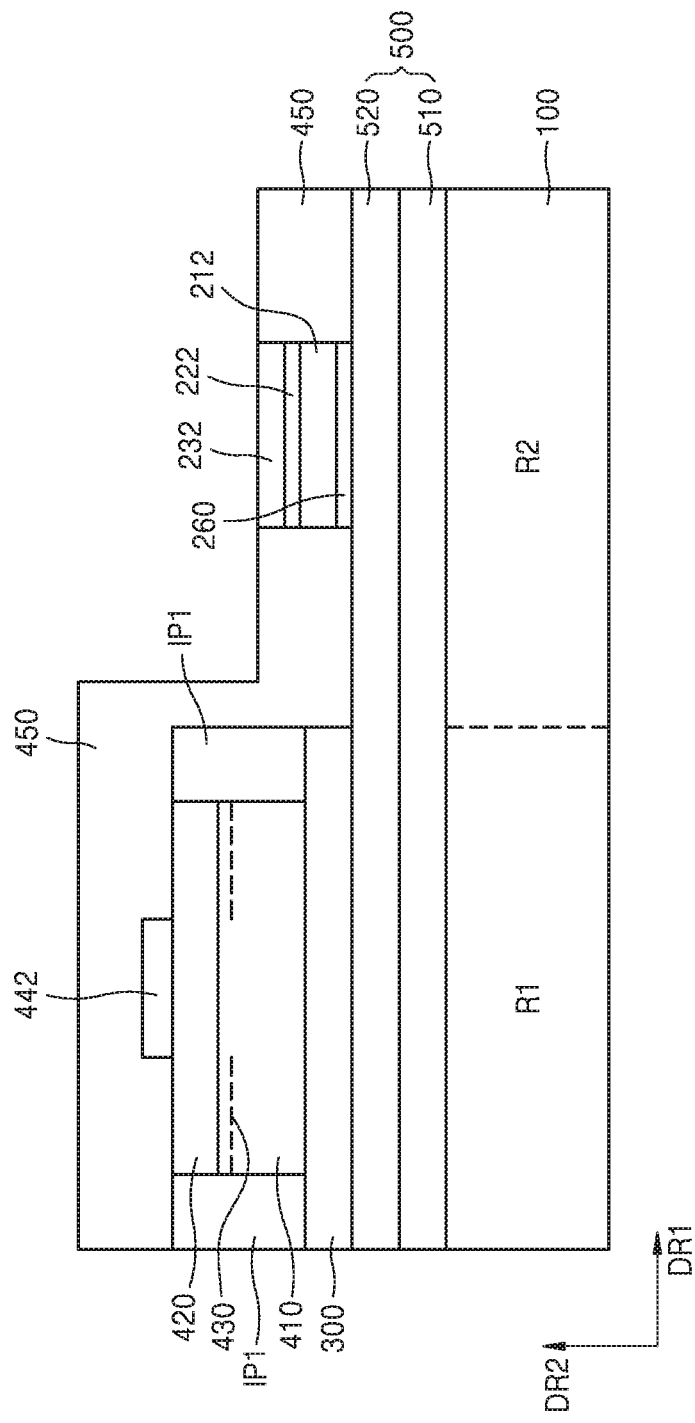
FIG. 14 is a diagram for explaining a method of manufacturing the semiconductor device described with reference to FIG. 9.

Referring to FIG. 14, a seed pattern 260, a lower semiconductor pattern 212, an active pattern 222, and an upper semiconductor pattern 232 may be sequentially formed in the passivation layer 450. The forming of the seed pattern 260, the lower semiconductor pattern 212, the active pattern 222, and the upper semiconductor pattern 232 may include forming an opening that exposes the upper seed layer 520 by patterning the passivation layer 450 and sequentially depositing the seed pattern 260, the lower semiconductor pattern 212, the active pattern 222, and the upper semiconductor pattern 232 in the opening. For example, the seed pattern 260, the lower semiconductor pattern 212, the active pattern 222, and the upper semiconductor pattern 232 may be formed by using an epitaxial growth process.

The seed pattern 260 may be for growing the lower semiconductor pattern 212. For example, the seed pattern 260 may include an AlGaN layer and a GaN layer that are sequentially stacked.

The lower semiconductor pattern 212 may include a III-V compound semiconductor having a first conductivity type. For example, the lower semiconductor pattern 212 may include n-type GaN.

The active pattern 222 may include an SQW, an MQW, SLs, or a combination thereof. For example, the active pattern 220 may include $In_xGa_{1-x}N/GaN$ ($0 \leq x < 1$).

The upper semiconductor pattern 232 may include a III-V compound semiconductor having a second conductivity type, the second conductivity type being different from the first conductivity type. For example, the upper semiconductor pattern 232 may include p-type GaN.

Referring back to FIG. 9, a source electrode S, a drain electrode D, a gate electrode G, and an anode AE may be formed. The forming of the source electrode S, the drain electrode D, the gate electrode G, and the anode AE may include forming openings that expose the channel supply layer 420 and the depletion formation pattern 442 by patterning the passivation layer 450, forming a conductive material film that fills the openings in the passivation layer 450, and exposing the passivation layer 450 between the openings by patterning the conductive material film. When the process of patterning the conductive material film is performed, a conductive material on the upper semiconductor pattern 232 may not be completely removed and a part thereof may remain. The conductive material remaining on the upper semiconductor pattern 232 may be referred to as an anode AE.

The disclosure may provide a method of manufacturing a semiconductor device in which the HEMT device 400 and the light-emitting device 200 different from each other are monolithically integrated on a single substrate 100.

Figure 15:
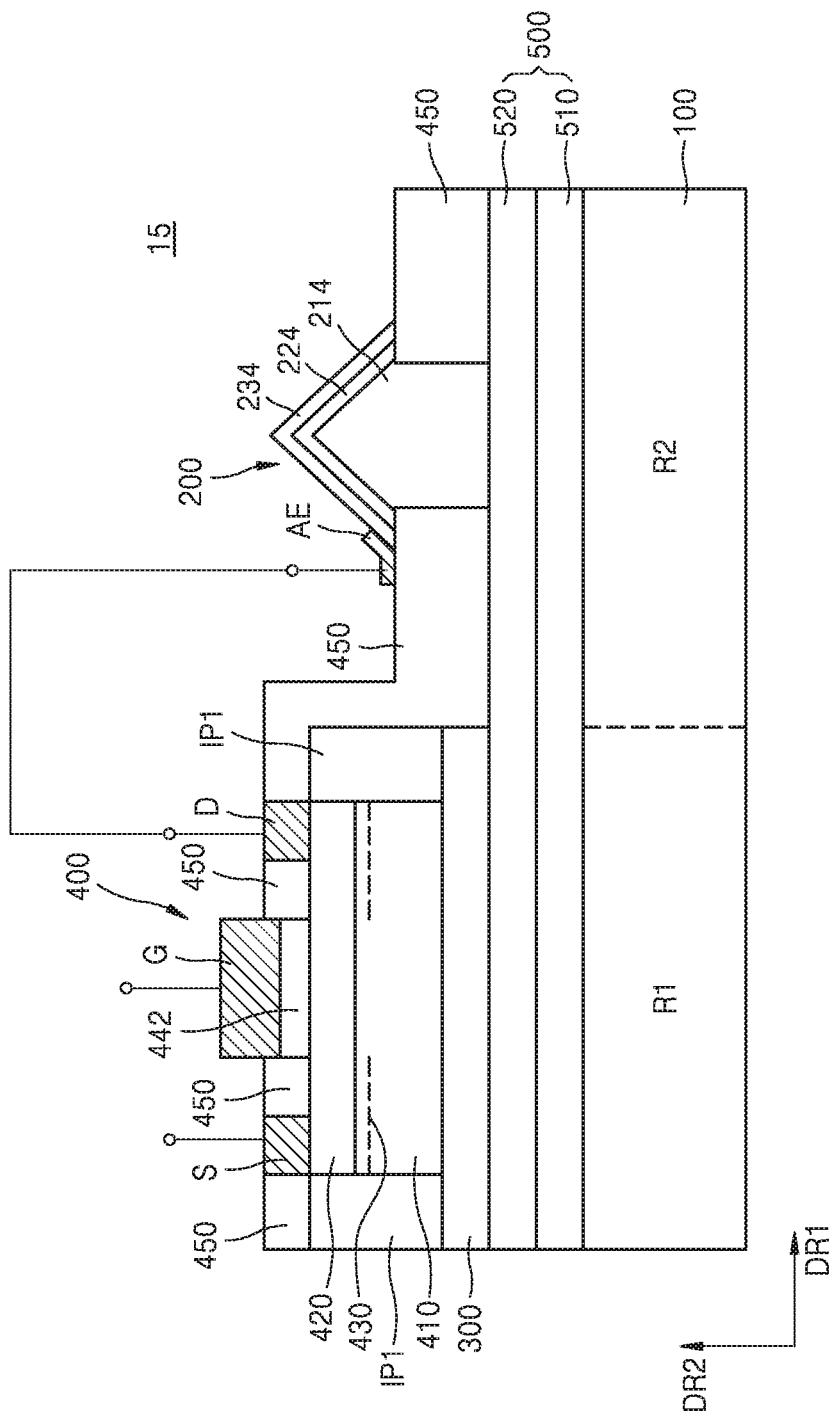
FIG. 15 is a diagram illustrating a semiconductor device according to an example embodiment.

FIG. 15 is a diagram illustrating a semiconductor device 15 according to embodiments. For brevity of description, substantially the same descriptions given with reference to FIG. 9 may be omitted.

Referring to FIG. 15, the semiconductor device 15 including a substrate 100, a light-emitting device 200, a separation layer 300, an HEMT device 400, first insulating patterns IP1, a passivation layer 450, and a seed layer structure 500 may be provided. The substrate 100, the separation layer 300, the HEMT device 400, the first insulating patterns IP1, the passivation layer 450, and the seed layer structure 500 may be substantially the same as those described with reference to FIG. 9.

The light-emitting device 200 may include an inner semiconductor pattern 214, an intermediate active pattern 224, and an outer semiconductor pattern 234. The inner semiconductor pattern 214 may extend through the passivation layer 450 to directly contact the upper seed layer 520. An upper portion of the inner semiconductor pattern 214 may protrude in the second direction DR2 from an upper surface of the passivation layer 450. For example, a width of the protruding portion in the first direction DR1 may be gradually reduced in the second direction DR2. However, the shape of the protruding portion is not limited thereto. The inner semiconductor pattern 214 may include a III-V compound semiconductor having a first conductivity type. For example, the inner semiconductor pattern 214 may include n-type GaN.

The intermediate active pattern 224 may be provided on the inner semiconductor pattern 214. The intermediate active pattern 224 may extend along a surface of the inner semiconductor pattern 214. The intermediate active pattern 224 may cover an upper surface of the inner semiconductor pattern 214. The intermediate active pattern 224 may generate light by receiving electrons and holes from the inner semiconductor pattern 214 and the outer semiconductor pattern 234. The intermediate active pattern 224 may include an SQW, an MQW, SLs, or a combination thereof. For example, the intermediate active pattern 224 may include $In_xGa_{1-x}N/GaN$ (0=x<1).

The outer semiconductor pattern 234 may be provided on the intermediate active pattern 224. The outer semiconductor pattern 234 may extend along a surface of the intermediate active pattern 224. The outer semiconductor pattern 234 may cover an upper surface of the intermediate active pattern 224. The outer semiconductor pattern 234 may include a III-V compound semiconductor having a second conductivity type, the second conductivity type being different from the first conductivity type. For example, the outer semiconductor pattern 234 may include p-type GaN.

An anode AE may be provided on the outer semiconductor pattern 234 and may extend onto the passivation layer 450. The anode AE may overlap both the outer semiconductor pattern 234 and the passivation layer 450 in the second direction DR2. A portion of a bottom surface of the anode AE may directly contact the upper semiconductor pattern 232, and the other portion thereof may directly contact the passivation layer 450. The anode AE may be electrically connected to the drain electrode D. The disclosure may provide the semiconductor device 15 in which the HEMT device 400 and the light-emitting device 200 different from each other are monolithically integrated on a single substrate 100.

Figure 16:
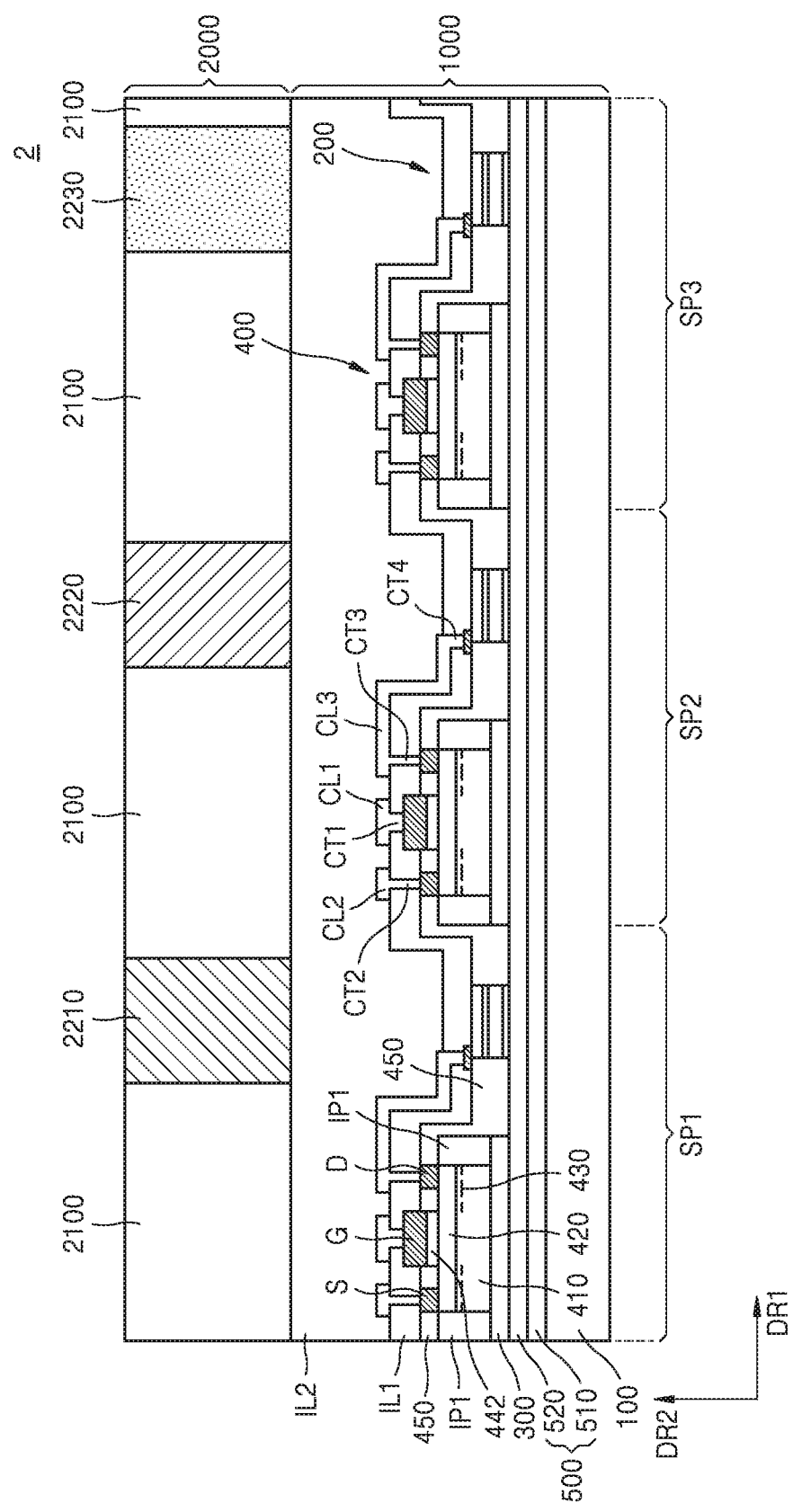
FIG. 16 is a diagram illustrating a display device according to an example embodiment.

FIG. 16 is a diagram illustrating a display device 2 according to embodiments. For brevity of description, substantially the same descriptions given with reference to FIGS. 8 and 9 may be omitted.

Referring to FIG. 16, the display device 2 including a composite layer 1000 and a light control layer 2000 may be provided. The composite layer 1000 may include a substrate 100, light emitting devices 200, a seed layer structure 500, separation layers 300, HEMT devices 400, first insulating patterns IP1, second insulating patterns IP2, a lower insulating layer IL1, the first through fourth contacts CT1, CT2, CT3, and CT4, first through third wires CL1, CL2, and CL3, and an upper insulating layer IL2. The substrate 100, the light-emitting devices 200, the seed layer structure 500, the separation layers 300, the HEMT devices 400, the first insulating patterns IP1, and the second insulating patterns IP2 may be substantially the same as those described with reference to FIG. 9. However, the substrate 100 and the seed layer structure 500 may extend across all of the first through third sub-pixels SP1, SP2, and SP3. In an example, the substrate 100, the light-emitting devices 200, the seed layer structure 500, the separation layers 300, the HEMT devices 400, the first insulating patterns IP1, and the second insulating pattern IP2 may be substantially the same as those described with reference to FIG. 15.

The lower insulating layer IL1, the first through fourth contacts CT1, CT2, CT3, and CT4, the first through third wires CL1, CL2, and CL3, and the upper insulating layer IL2 may be substantially the same as described with reference to FIG. 8.

The light control layer 2000 may be provided on the upper insulating layer IL2. The light control layer 2000 may be substantially the same as the light control layer 2000 described with reference to FIG. 8.

The disclosure may provide the display device 2 including a semiconductor device in which multiple HEMT devices 400 and light-emitting devices 200 different from each other are monolithically integrated on a single substrate 100.

Figure 17:
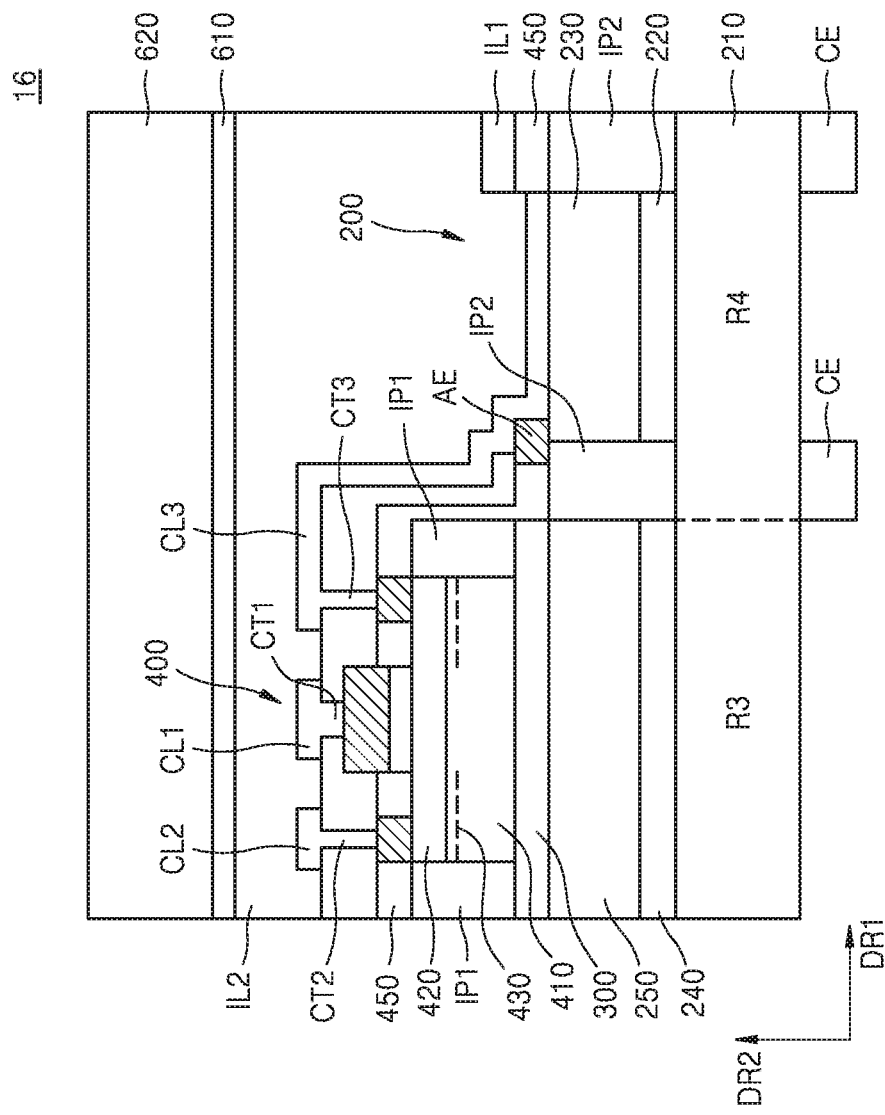
FIG. 17 is a diagram illustrating a semiconductor device according to an example embodiment.

FIG. 17 is a diagram illustrating a semiconductor device 16 according to embodiments. For brevity of description, the contents substantially the same as those described with reference to FIG. 1 and with reference to FIG. 8 may be omitted.

Referring to FIG. 17, the semiconductor device 16 including a light emitting device 200, a separation layer 300, an HEMT device 400, first insulating patterns IP1, second insulating patterns IP2, a lower insulating layer IL1, first through fourth contacts CT1, CT2, CT3, and CT4, first through third wirings CL1, CL2, and CL3, an upper insulating layer IL2, a bonding layer 610, a subsequent substrate 620, and a cathode CE may be provided.

The light emitting device 200, the separation layer 300, the HEMT device 400, the first insulating patterns IP1, and the second insulating patterns IP2 may be substantially the same as those described with reference to FIG. 1.

The substrate 100 described with reference to FIG. 1 may be removed after forming the subsequent substrate 620. The lower semiconductor layer 210 may include a third region R3 and a fourth region R4. The third region R3 may be provided on the first region R1 (refer to FIG. 1) of the substrate 100 such that the third region R3 overlaps the first region R1 in the second direction DR2. The fourth region R4 may be provided on the second region R2 (refer to FIG. 1) such that the fourth region R4 overlaps the second region R2 in the second direction DR2.

The lower insulating layer IL1, the first through fourth contacts CT1, CT2, CT3, and CT4, the first through third wires CL1, CL2, and CL3, and the upper insulating layer IL2 may be substantially the same as described with reference to FIG. 8. However, the third wiring CL3 may extend onto the upper semiconductor layer 230 beyond the anode AE. The third wiring CL3 may cover an upper surface of the upper semiconductor layer 230. The third wiring CL3 may reflect light. For example, the third wiring CL3 may reflect a portion of light that is emitted from the active layer 220 and passes through the upper semiconductor layer 230 so that the reflected portion of light travels towards the lower semiconductor layer 210.

The subsequent substrate 620 may be provided on the upper insulating layer IL2. The subsequent substrate 620 may be substantially the same as the substrate 100 described with reference to FIG. 1. For example, the subsequent substrate 620 may include a silicon substrate, a glass substrate, a sapphire substrate, or a silicon substrate coated with $SiO_2$. However, the substrate 100 is not limited thereto.

The bonding layer 610 may bond the upper insulating layer IL2 and the subsequent substrate 620. For example, the bonding layer 610 may include a silicon based bonding material.

Cathodes CE may be provided under the lower semiconductor layer 210. The cathodes CE may be provided under the fourth region R4. The cathodes CE may be electrically connected to the lower semiconductor layer 210. The cathodes CE may apply a ground voltage to the lower semiconductor layer 210. The cathodes CE respectively may overlap the second insulating patterns IP2 in the second direction DR2.

When a driving voltage and a ground voltage are respectively applied to the anode AE and the cathodes CE, light may be emitted from the active layer 220. Some of the light emitted from the active layer 220 may be emitted through a bottom surface of the lower semiconductor layer 210 after being reflected by the third wiring CL3, and the other portion of the light may be emitted through the bottom surface of the lower semiconductor layer 210 immediately after the emission.

The disclosure may provide the semiconductor device 16 in which the HEMT device 400 and the light-emitting device 200 different from each other are monolithically integrated on a single substrate 100.

Figure 18:
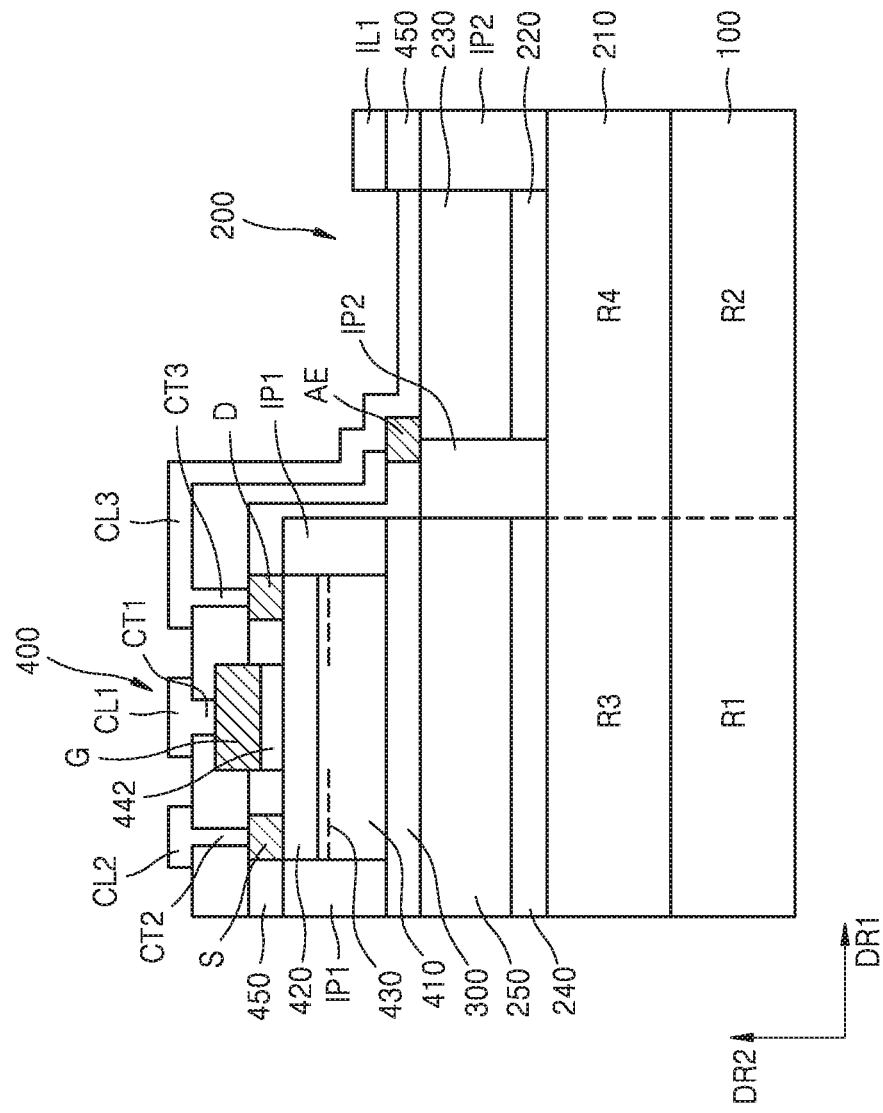
FIG. 18 is a diagram for explaining a method of manufacturing the semiconductor device described with reference to FIG. 17.
Figure 19:
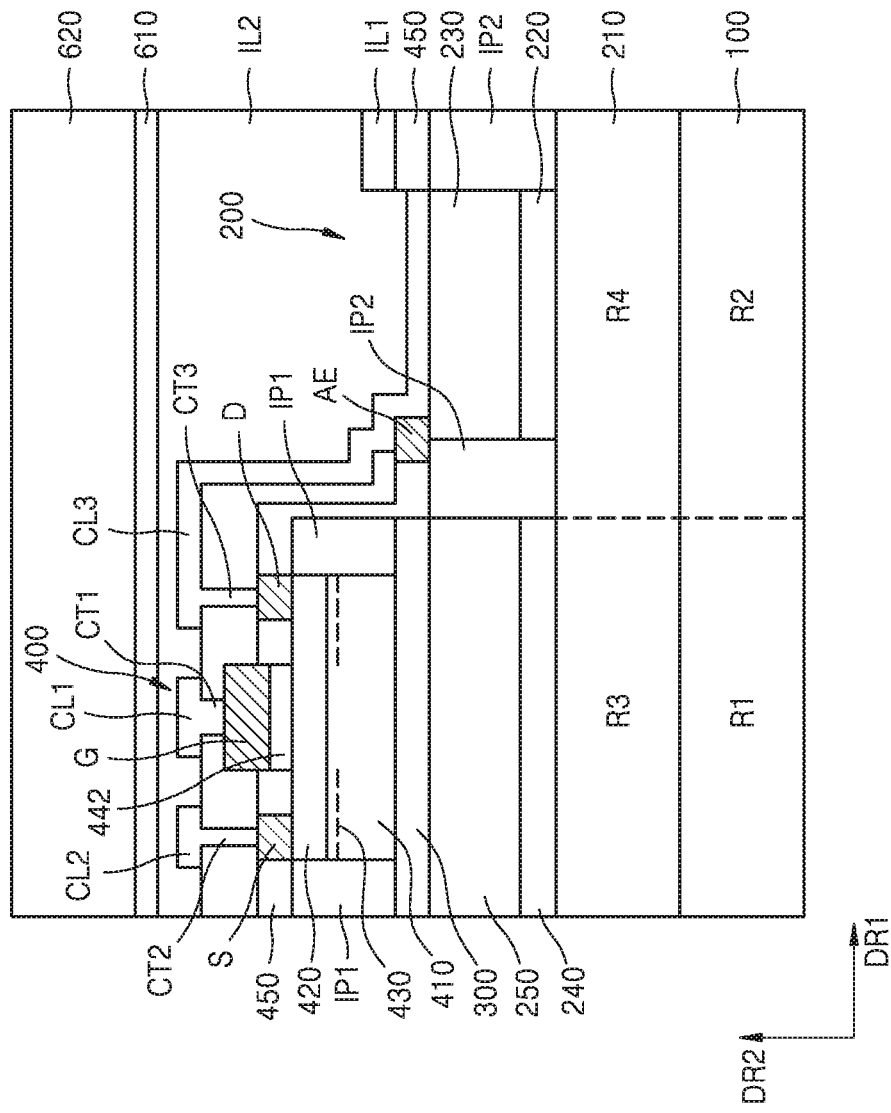
FIG. 19 is a diagram for explaining a method of manufacturing the semiconductor device described with reference to FIG. 17.

FIGS. 18 and 19 are diagrams for explaining methods of manufacturing the semiconductor device described with reference to FIG. 17. For brevity of description, substantially the same descriptions given with reference to FIGS. 2 through 5 and FIG. 8 may be omitted.

Referring to FIG. 18, a substrate 100, a light-emitting device 200, a lower spacer layer 240, an upper spacer layer 250, a separation layer 300, an HEMT device 400, first insulating patterns IP1, second insulating patterns IP2, a lower insulating layer IL1, first through third contacts CT1, CT2, and CT3, and first through third wirings CL1, CL2, and CL3 may be formed. The forming of the substrate 100, the light-emitting device 200, lower spacer layer 240, the upper spacer layer 250, the separation layer 300, the HEMT device 400, the first insulating patterns IP1, and the second insulation patterns IP2 may be substantially the same as described with reference to FIGS. 2 through 5.

A region of the lower semiconductor layer 210 overlapping the first region R1 of the substrate 100 in the second direction DR2 may be referred to as a third region R3. A region of the lower semiconductor layer 210 overlapping the second region R2 of the substrate 100 in the second direction DR2 may be referred to as a fourth region R4.

The lower insulating layer IL1 may be formed on the HEMT device 400 and the light-emitting device 200. For example, the lower insulating layer IL1 may be formed by using a chemical vapor deposition (CVD) process, a physical vapor deposition (PVD) process, or an atomic layer deposition (ALD) process. The lower insulating layer IL1 may extend along surfaces of the HEMT device 400 and the light-emitting device 200.

The first through third contacts CT1, CT2, and CT3 may be formed in the lower insulating layer IL1. The first through third contacts CT1, CT2, and CT3 respectively may be formed on the gate electrode G, the source electrode S, and the drain electrode D. The first through third wirings CL1, CL2, and CL3 respectively may be formed on the first through third contacts CT1, CT2, and CT3. The third wiring CL3 may be formed to extend onto the upper semiconductor layer 230. The process of forming the first through third contacts CT1, CT2, and CT3 and the first through third wirings CL1, CL2, and CL3 may include forming openings in the lower insulating layer IL1 exposing a gate electrode G, a source electrode S, and a drain electrode D, forming a conductive material film filling the openings in the lower insulating layer IL1, and patterning the conductive material film.

Referring to FIG. 19, an upper insulating layer IL2 may be formed on the lower insulating layer IL1. For example, the upper insulating layer IL2 may be formed by using a CVD process, a PVD process, or an ALD process. An upper surface of the upper insulating layer IL2 may be flat.

A bonding layer 610 may be formed on the upper insulating layer IL2. For example, the bonding layer 610 may include a silicon based bonding material.

A subsequent substrate 620 may be formed on the bonding layer 610. For example, the subsequent substrate 620 may include a silicon substrate, a glass substrate, a sapphire substrate, a $SiO_2$ coated silicon substrate. However, the type of subsequent substrate 620 is not limited thereto.

Referring to FIG. 17, the substrate 100 may be removed. For example, the substrate 100 may be removed by using a chemical peeling method or a mechanical peeling method.

Cathodes CE may be formed on a bottom surface of the lower semiconductor layer 210 where the bottom surface is exposed by removing the substrate 100. The process of forming the cathodes CE may include forming a conductive material film to cover the bottom surface of the lower semiconductor layer 210 and patterning the conductive material film.

Figure 20:
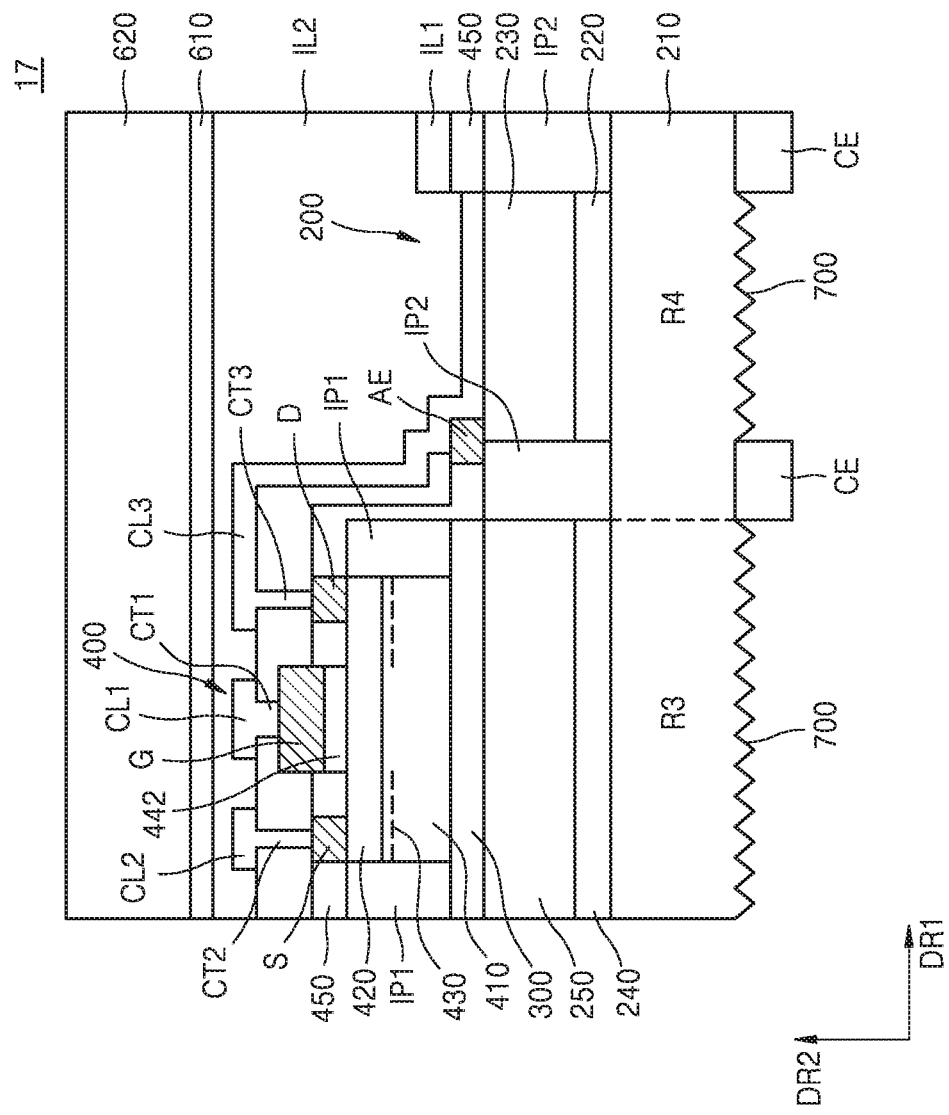
FIG. 20 is a diagram illustrating a semiconductor device according to an example embodiment.

FIG. 20 is a diagram illustrating a semiconductor device 17 according to embodiments. For brevity of description, substantially the same descriptions given with reference to FIG. 17 may be omitted.

Referring to FIG. 20, the semiconductor device 17 including a light-emitting device 200, a separation layer 300, an HEMT device 400, first insulating patterns IP1, second insulating patterns IP2, a lower insulating layer IL1, first through fourth contacts CT1, CT2, CT3, and CT4, first through third wirings CL1, CL2, and CL3, an upper insulating layer IL2, a bonding layer 610, a subsequent substrate 620, a cathode CE, and light extraction patterns 700 may be provided.

The light-emitting device 200, the separation layer 300, the HEMT device 400, the first insulating patterns IP1, the second insulating patterns IP2, the lower insulating layer IL1, the first through fourth contacts CT1, CT2, CT3, and CT4, the first through third wirings CL1, CL2, and CL3, the upper insulating layer IL2, the bonding layer 610, the subsequent substrate 620, and the cathode CE may be substantially the same as described with reference to FIG. 17.

A bottom surface of the lower semiconductor layer 210 may have a corrugate structure. The corrugate structure may be referred to as the light extraction patterns 700. That is, the light extraction patterns 700 may be provided under the lower semiconductor layer 210. The light extraction patterns 700 may be formed by patterning a lower portion of the lower semiconductor layer 210. The light extraction patterns 700 may increase the emission efficiency of light emitted from the light emitting device 200 to the outside of the semiconductor device 17. In an example, the light extraction patterns 700 may be a structure different from the lower semiconductor layer 210. In this case, an interface may be provided between the light extraction patterns 700 and the lower semiconductor layer 210.

Figure 21:
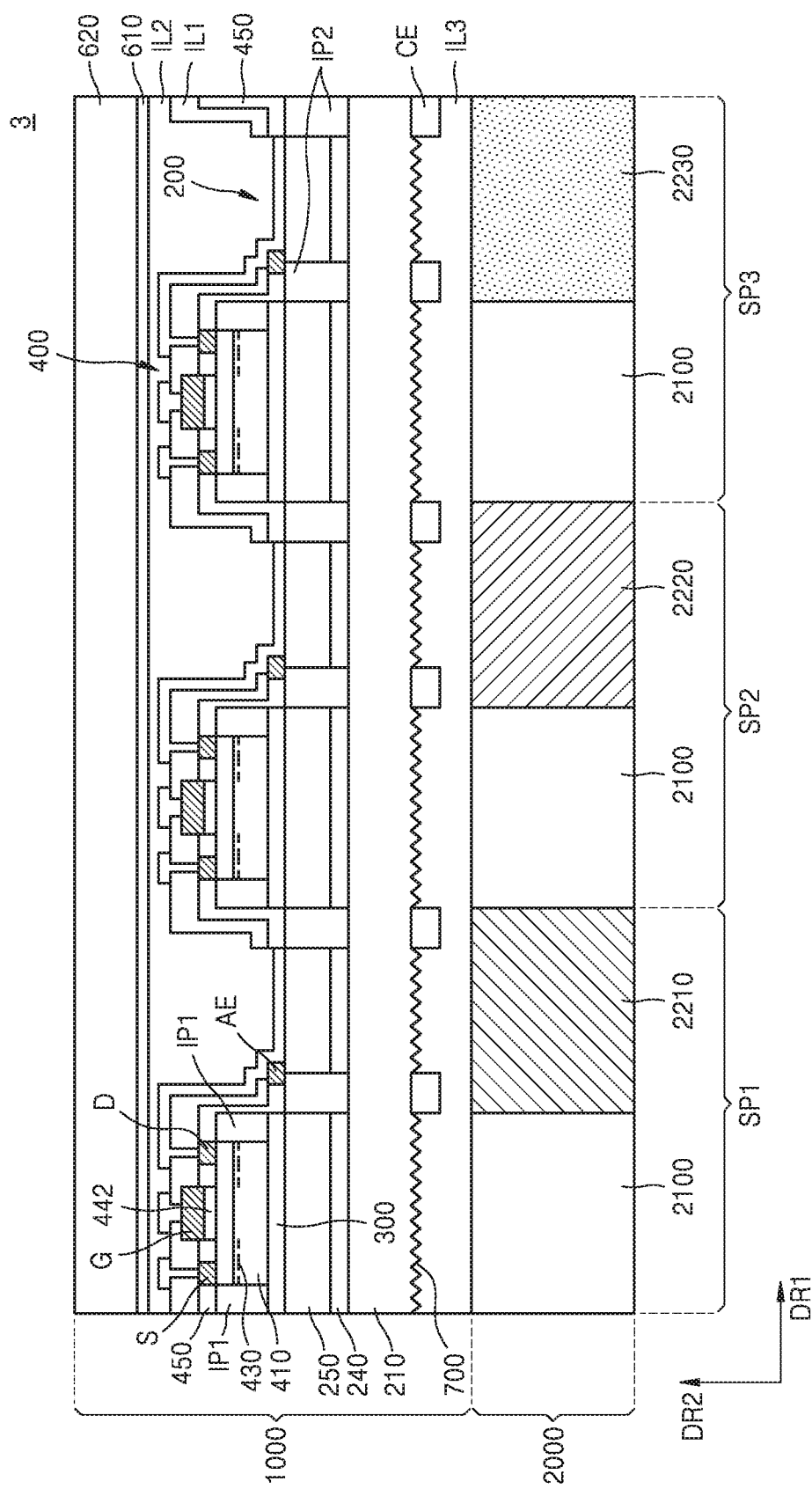
FIG. 21 is a diagram illustrating a display device according to an embodiment.

FIG. 21 is a diagram illustrating a display device 3 according to an example embodiment. For brevity of description, substantially the same descriptions given with reference to FIGS. 8 and 20 may be omitted.

Referring to FIG. 21, the display device 3 including a composite layer 1000 and a light control layer 2000 may be provided.

The composite layer 1000 may include light-emitting devices 200, a separation layer 300, HEMT devices 400, first insulating patterns IP1, second insulating patterns IP2, a lower insulating layer IL1, first through fourth contacts CT1, CT2, CT3, and CT4, first through third wirings CL1, CL2, and CL3, an upper insulating layer IL2, a bonding layer 610, a subsequent substrate 620, cathodes CE, light extraction patterns 700, and an interlayer insulating layer IL3. The light-emitting devices 200, the separation layer 300, the HEMT devices 400, the first insulating patterns IP1, the second insulating patterns IP2, the lower insulating layer IL1, the first through fourth contacts CT1, CT2, CT3, and CT4, first through third wirings CL1, CL2, and CL3, the upper insulating layer IL2, the bonding layer 610, the subsequent substrate 620, the cathodes CE, and the light extraction patterns 700 may be substantially the same as those described with reference to FIG. 20.

However, the lower semiconductor layer 210, the bonding layer 610, and the subsequent substrate 620 may extend across all of the first through third sub-pixels SP1, SP2, and SP3. In another example embodiment, the light extraction patterns 700 may not be provided as shown in FIG. 17.

The interlayer insulating layer IL3 may be provided under the lower semiconductor layer 210. The interlayer insulating layer IL3 may cover a bottom surface of the lower semiconductor layer 210. The cathodes CE may be provided between the lower semiconductor layer 210 and the interlayer insulating layer IL3. A bottom surface of the interlayer insulating layer IL3 may be flat. For example, the interlayer insulating layer IL3 may include silicon oxide or silicon nitride.

The light control layer 2000 may be provided on an opposite side of the lower semiconductor layer 210 with the interlayer insulating layer IL3 therebetween. The light control layer 2000 may cover the bottom surface of the interlayer insulating layer IL3. The light control layer 2000 may be substantially the same as described with reference to FIG. 8.

The example embodiments may provide the display device 3 including a semiconductor device in which multiple HEMT devices 400 and light-emitting devices 200 different from each other are monolithically integrated on the single substrate 100.

Further, the example embodiments may provide a semiconductor device including an HEMT device and a light-emitting device that are monolithically integrated on a single substrate.

Further still, the example embodiments may provide a method of manufacturing a semiconductor device including an HEMT device and a light-emitting device that are monolithically integrated on a single substrate.

Further still, the disclosure may provide a display device including HEMT devices and light-emitting devices that are monolithically integrated on a single substrate.

However, the effects of the embodiments are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
    a substrate including a first region and a second region that are arranged in a first direction;
    a separation layer provided on the first region of the substrate;
    a high electron mobility transistor (HEMT) device overlapping the separation layer in a second direction;
    a light-emitting device provided on the second region of the substrate; and
    a first insulating pattern covering a side surface of the HEMT device,
    a second insulating pattern covering side surfaces of the light-emitting device,
    wherein the first insulating pattern overlaps the separation layer in the second direction, and
    wherein the second insulating pattern is provided between the separation layer and the substrate in the second direction.

2. The semiconductor device of claim 1, wherein the separation layer includes a first region that corresponds to the HEMT device and a second region that corresponds to the first insulating pattern, and
    wherein a thickness of the first region of the separation layer in the second direction is greater than a thickness of the second region of the separation layer in the second direction.

3. The semiconductor device of claim 1, wherein the light-emitting device comprises:
    an upper semiconductor layer;
    an active layer provided between the upper semiconductor layer and the substrate; and
    a lower semiconductor layer provided between the active layer and the substrate, wherein the lower semiconductor layer extends in the first direction between the second insulating pattern and the substrate, wherein the lower semiconductor layer includes a first region that overlaps the active layer in the second direction and a second region that overlaps the second insulating pattern in the second direction, and wherein a thickness of the first region of the lower semiconductor layer in the second direction is greater than a thickness of the second region of the lower semiconductor layer in the second direction.

4. The semiconductor device of claim 3, further comprising:

an upper spacer layer provided between the separation layer and the substrate; and a lower spacer layer provided between the upper spacer layer and the substrate, wherein the lower semiconductor layer extends in the first direction between the lower spacer layer and the substrate.

5. The semiconductor device of claim 1, wherein the light-emitting device overlaps the separation layer in the first direction.

6. The semiconductor device of claim 5, wherein the light-emitting device comprises:

an upper semiconductor layer;

an active layer provided between the upper semiconductor layer and the substrate; and a lower semiconductor layer provided between the active layer and the substrate, and wherein the lower semiconductor layer, the active layer, and the upper semiconductor layer are sequentially stacked on the second region.

7. The semiconductor device of claim 5, wherein the light-emitting device comprises:

an inner semiconductor pattern extending in the second direction;

a light-emitting pattern covering side surfaces and an upper surface of the inner semiconductor pattern; and an outer semiconductor pattern covering side surfaces and top surfaces of the light-emitting pattern.

8. The semiconductor device of claim 1, wherein the HEMT device is provided between the substrate and the separation layer.

9. The semiconductor device of claim 8, wherein the light-emitting device comprises:

an upper semiconductor layer;

an active layer between the upper semiconductor layer and the substrate; and a lower semiconductor layer between the active layer and the substrate, and wherein the HEMT device extends in the first direction at a position between the upper semiconductor layer and the substrate.

10. The semiconductor device of claim 9, further comprising light extraction patterns on the upper semiconductor layer.

11. A display device comprising:

a substrate;

light-emitting devices provided on the substrate;

separation layers respectively provided between the light-emitting devices;

high electron mobility transistor (HEMT) devices respectively overlapping the separation layers in a first direction;

first insulating patterns respectively provided on side surfaces of the HEMT devices; and second insulating patterns respectively provided on side surfaces of the light-emitting devices, wherein the first insulating patterns overlap the separation layers in the first direction, and wherein the second insulating pattern is provided between the separation layers and the substrate in the first direction.

12. The display device of claim 11, wherein the HEMT devices are provided between the separation layers and the substrate.

* * * * *